(12) United States Patent
Asai et al.

(10) Patent No.: US 6,334,840 B1
(45) Date of Patent: Jan. 1, 2002

(54) ELECTRIC-COMPONENT TRANSFERRING APPARATUS, AND METHOD AND APPARATUS FOR EXCHANGING COMPONENT HOLDERS THEREIN

(75) Inventors: Koichi Asai, Nagoya; Takeyoshi Isogai, Hekinan; Yasunori Kamegai, Chiryu, all of (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 0 days.

(21) Appl. No.: 09/234,489

(22) Filed: Jan. 21, 1999

(30) Foreign Application Priority Data

Feb. 2, 1998 (JP) ............................................ 10-021087

(51) Int. Cl.$^7$ ........................... B23Q 3/155; B23P 21/00
(52) U.S. Cl. ............................... 483/1; 29/740; 483/59; 483/61; 483/69
(58) Field of Search ............................. 483/54, 55, 56, 483/69, 1, 13, 902, 59, 60, 61; 414/783; 901/47; 29/740, 743; 294/64.1

(56) References Cited

U.S. PATENT DOCUMENTS

| | | | |
|---|---|---|---|
| 4,611,397 A | * 9/1986 | Janisiewicz | 29/834 |
| 5,201,696 A | * 4/1993 | Kinback | 483/54 |
| 5,570,993 A | * 11/1996 | Onodera et al. | 29/740 X |
| 5,807,221 A | * 9/1998 | Yi | 483/55 X |
| 5,833,591 A | * 11/1998 | Abe et al. | 483/12 |
| 5,839,187 A | * 11/1998 | Sato et al. | 29/743 |
| 5,908,282 A | * 6/1999 | Onodera | 414/783 |
| 5,996,203 A | * 12/1999 | Abe et al. | 29/740 X |

FOREIGN PATENT DOCUMENTS

| | | |
|---|---|---|
| EP | 0 293 175 A2 | 11/1988 |
| JP | A-6-296093 | 10/1994 |
| JP | B2-7-34517 | 4/1995 |
| JP | 9-272092 | 10/1997 |

* cited by examiner

Primary Examiner—William Briggs
(74) Attorney, Agent, or Firm—Oliff & Berridge, PLC

(57) ABSTRACT

An electric-component transferring apparatus including a plurality of component holders each of which holds an electric component, and having the function of exchanging the component holders, the apparatus including a holder chuck which holds each of the component holders such that each component holder is removable therefrom; a chuck moving device which moves the holder chuck to transfer the electric component held by each component holder held by the holder chuck; a holder holding member which holds the component holders such that each of the component holders is allowed to be removed therefrom; a holding-member holding device which holds the holder holding member such that the holder holding member is removable therefrom; and a holder-exchange moving device which moves at least one of the holder chuck and the holder holding member relative to each other so that the holder chuck exchanges one of the component holders that is held thereby, with another of the component holders that is held by the holder holding member.

19 Claims, 18 Drawing Sheets

ELECTRIC-COMPONENT TRANSFERRING APPARATUS, AND METHOD AND APPARATUS FOR EXCHANGING COMPONENT HOLDERS THEREIN

BACKGROUND OF THE INVENTION

1. Field of the Invention

The present invention relates to an apparatus for transferring electric components used for providing an electric circuit (e.g., an electronic circuit), and a method and an apparatus for exchanging component holders in the transferring apparatus, and particularly to the art of improving the efficiency of exchanging of the component holders.

2. Related Art Statement

There is known an electric-component ("EC") transferring device which includes one or more holders such as a suction nozzle which sucks and holds an EC by applying a vacuum (i.e., negative air pressure) thereto. The EC transferring device may be employed as an EC transferring and mounting device in an EC mounting system. The EC transferring and mounting device receives one or more ECs from an EC supplying device of the EC mounting system, transfers the ECs, and delivers the ECs to an object such as a printed circuit board ("PCB") as a sort of circuit substrate or a sort of EC receiving member. The delivering of the ECs to the PCB means the mounting of the ECs on the PCB. Thus, the EC transferring and mounting device functions as not only an EC transferring device but also an EC mounting device.

There are known an EC transferring device which includes only one holder and which transfers ECs, one by one, using the single holder, and an EC transferring device which includes a plurality of holders and which transfers a plurality of ECs, at one time, using the plurality of holders. In either case, the single holder, or each of the plurality of holders, is detachably attached to a holder chuck. The single holder, or the plurality of holders, is or are selected from various sorts of holders, depending upon the sort or sorts of ECs to be transferred. Therefore, when the current sort or sorts of ECs are changed to a different sort or sorts of ECs, the current sort of single holder, or the current sorts of holders, is or are changed to a different sort of holder, or different sorts of holders, corresponding to the different sort or sorts of ECs.

In the above-indicated background, it has been known an EC transferring device including a holder chuck to which a holder is detachably attached, and a holder exchanging device which holds a plurality of holders and which exchanges one of the holders held thereby, with the holder held by the holder chuck. The holder exchanging device includes a plurality of holder holding portions each of which holds a holder such that the holder is removable therefrom. The holder held by the holder chuck is exchanged with one of the holders held by the holder exchanging device, as follows: First, the holder held by the holder chuck is held by an empty holder holding portion of the holder exchanging device, and a holder held by a different holder holding portion is held by the empty holder chuck. In a particular case where a holder other than the holders held by the holder exchanging device is needed, one of the holders held by the holder exchanging device is manually exchanged with the holder needed, by an operator.

However, it is cumbersome for the operator to exchange each of the holders held by the holder exchanging device, with a different holder. As the number of holders to be exchanged increases, the operator's work and time needed to do that increases. For example, it is assumed that in an EC transferring and mounting device including a holder exchanging device holding a number of holders, a current sort of PCBs are changed to a different sort of PCBs and accordingly current sorts of ECs corresponding to the current sort of PCBs are changed to different sorts of ECs corresponding to the different sort of PCBs. In the case of the above transferring and mounting device, an operator must exchange a number of holders held by the holder exchanging device, with a number of different holders corresponding to the different sorts of ECs corresponding to the different sort of PCBs. This work is cumbersome and time-consuming. Moreover, it needs a long time period in which ECs cannot be mounted on PCBs. Thus, the EC transferring and mounting device suffers from a low EC-mount efficiency. Regarding an EC transferring device including a single holder chuck to which a holder selected from various holders is detachably attached, it is cumbersome for an operator to exchange the holder held by the holder chuck, with one selected from th e various holders, if the frequency of exchanging of holders is high.

It is usual that a holder exchanging device is provided in, or near to, an EC-transfer area defined by an EC transferring device, in order that the holder exchanging device can quickly exchange holders with a holder chuck. However, there are many peripheral devices or members around the EC transferring device and accordingly an operator must do his or her work in a narrow space with a low working efficiency.

SUMMARY OF THE INVENTION

It is therefore an object of the present invention to provide an electric-component transferring apparatus which can easily exchange component holders.

It is another object of the present invention to provide a component-holder exchanging method which can easily exchange component holders.

It is another object of the present invention to provide a component-holder exchanging apparatus which can easily exchange component holders.

The present invention provides an electric-component transferring apparatus, a component-holder exchanging method, and a component-holder exchanging apparatus which have one or more of the technical features that are described below in respective paragraphs given parenthesized sequential numbers (1) to (17). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed. However, the following technical features and the appropriate combinations thereof are just examples to which the present invention is by no means limited.

(1) According to a first feature of the present invention, there is provided an electric-component transferring apparatus including a plurality of component holders each of which holds an electric component, and having the function of exchanging the component holders, the apparatus comprising a holder chuck which holds each of the component holders such that the each component holder is removable therefrom; a chuck moving device which moves the holder chuck to transfer the electric component held by the each component holder held by the holder chuck; a holder holding member which holds the component holders such that each of the component holders is allowed to be removed therefrom; a holding-member holding device which holds the holder holding member such that the holder holding member is removable therefrom; and a holder-exchange moving device which moves at least one of the holder chuck and the holder holding member relative to each other so that the holder chuck exchanges one of the component holders that is held thereby, with another of the component holders that is held by the holder holding member. Suction nozzles each of which sucks and holds an electric component ("EC") by applying vacuum thereto are preferably used as the component holders. However, other sorts of component holders may be employed, such as component holders each of which includes a plurality of holding claws which are opened and closed to hold an EC. The chuck moving device may be embodied in various manners. For example, the chuck moving device may be one which includes an intermittent-rotation body which is intermittently rotatable about an axis line and which supports a plurality of holder chucks such that the holder chucks are equiangularly spaced from each other about the axis line at a predetermined spacing angular pitch equal to a predetermined intermittent-rotation angular pitch at which the rotation body is intermittently rotated; and a rotating device which intermittently rotates the rotation body at the intermittent-rotation angular pitch so that the holder chucks are sequentially stopped at each of a plurality of stop positions. The chuck moving device may be one which includes a plurality of rotary members which are rotatable about a common axis line, independent of each other, and which supports a plurality of holder chucks, respectively; and a rotary-motion applying device which applies, to each of the rotary members, a rotary motion which assures that the each rotary member is rotated by 360 degrees about the common axis line, is stopped at least one time during each full rotation, and keeps a predetermined time difference from each of its preceding and following rotary members. The holder chucks supported by the rotary members are sequentially stopped at least one time together with the corresponding rotary members. The axis line of rotation of the above-indicated intermittent-rotation body or the common axis line of rotation of the rotary members may be vertical, or may be inclined relative to a vertical plane. Each of the holder chucks supported by the intermittent-rotation body or the rotary members may be moved by an axial-direction moving device in an axial direction parallel to the axis line of rotation or the common axis line of rotation. The chuck moving device employed by the EC transferring apparatus according the first feature (1) comprises this axial-direction moving device. The intermittent-rotation body or the rotary members which supports or support the holder chucks may be moved by an X-Y moving device such as an X-Y robot to an arbitrary position on a horizontal plane. The chuck moving device of the apparatus according the first feature (1) comprises the X-Y moving device. The chuck moving device may be one which includes a movable member which is movable in at least one of two directions perpendicular to each other on a plane and on which at least one holder chuck is provided; and a moving device which moves the movable member. The holder chuck may be moved, on the movable member, in a direction intersecting the one direction. The movable member may be moved along a straight line, a curved line, or a combination of those lines. In the present EC transferring apparatus, when component holders are exchanged, at least one of the holder holding member and the holder chuck is moved relative to each other by the holder-exchange moving device, so that component holders are exchanged. In the case where one or more component holders different from those held by the current holder holding member are needed, the current holder holding member is exchanged with a different holder holding member. Since the current holder holding member is held by the holding-member holding device such that the holding member is removable from the holding device, the current holder holding member can be exchanged with a different holder holding member. A plurality of component holders held by the current holder holding member are simultaneously exchanged with a plurality of other component holders, by exchanging the current holder holding member with a different holder holding member. Thus, the present EC transferring apparatus assures that component holders are exchanged more easily and more quickly than a prior apparatus which just allows component holders, one by one, to be attached to, and detached from, a holder holding device. The holder holding member removed from the holding-member holding device may be carried to a position distant from the EC transferring apparatus. Thus, the component holders held by the holder holding member removed may be exchanged with other component holders not in a narrow space surrounded by the elements of the transferring apparatus, but in a wide space distant from the apparatus. Thus, the holder-exchange efficiency is improved. Moreover, the holder holding member which is held by the holding-member holding device such that the holding member is removable from the holding device, may be selected from a plurality of holder holding members. In the latter case, each of the plurality of holder holding members can be commonly used with each of respective holding-member holding devices of a plurality of EC transferring apparatuses of a single sort or different sorts.

(2) According to a second feature of the present invention that includes the first feature (1), the holder chuck holds each of the component holders, with a holding force, such that the holder chuck allows the each component holder to be removed therefrom when a force greater than the holding force is applied to the each component holder in a direction in which the each component holder is moved away from the holder chuck, and the apparatus further comprises a holder-removal inhibiting member which is attached to the holder holding member such that the holder-removal inhibiting member is movable to an operative position thereof where the inhibiting member inhibits each of the component holders from being removed from the holder holding member and to an inoperative position thereof where the inhibiting member allows the each component holder to be removed from the holder holding member; and an inhibiting-member moving device which moves the holder-removal inhibiting member to each of the operative and inoperative positions thereof. When the component holder held by the holder chuck is returned to the holder holding member, the holder-removal inhibiting member is moved to its inoperative position where the inhibiting member allows the holder chuck to place the component holder on the holder holding member, and subsequently is moved to its operative position where the inhibiting member inhibits the component holder from being removed from the holder holding member. When the holder chuck is moved in a direction away from the component holder, the component holder receives a force greater than the holding force of the holder chuck, in a direction in which the component holder is moved away from the holder chuck. Thus, the component holder is removed from the holder chuck. The holder-removal inhibiting member in its operative position helps the component holder removed from the holder chuck. Generally, the holder-removal inhibiting member in its operative position inhibits each of the component holders held by the holder holding member, from being removed from the same. More specifically described, the holder-removal inhibiting member may be a cover or a shutter which is normally held at its operative position where the cover or shutter covers and protects the component holders held by the holder holding member and which is moved to its inoperative position when one of the component holders is removed from the holder holding member. In the case where a main function of the inhibiting member is to inhibit each of the plurality of component holders from being removed from the holder holding member, the inhibiting member may be just required to do so and accordingly it may be one which includes a plurality of holder-removal inhibiting portions provided at respective positions corresponding to the plurality of component holders held by the holding member. On the other hand, in the case where a main function of the inhibiting member is to protect each component holder, it is preferred that the inhibiting member be one which as largely as possible covers each component holder held by the holding member. In the latter case, for example, the inhibiting member may be a plate-like member which has a plurality of openings each of which has a dimension slightly larger than the largest dimension of each component holder. It is preferred that the inhibiting member be moved by the inhibiting-member moving device in a direction perpendicular to the direction in which the holder chuck removes each component holder from the holding holding member, i.e., in a direction parallel to the plane on which the plurality of component holders are held by the holder holding member. In a particular case where the holder holding member and the holding-member holding device are provided between a printed-circuit-board ("PCB") conveyor and an EC supplying device, the holder-removal inhibiting member may be moved to each of its operative and inoperative positions in a direction perpendicular to the direction in which the PCB conveyor and the EC supplying device are arranged. In the last case, it is not needed to widen the distance between the PCB conveyor and the EC supplying device, for the purpose of allowing the inhibiting member to be moved to each of its operative and inoperative positions. Thus, an EC mounting system including the EC transferring apparatus, the PCB conveyor, and the EC supplying device can enjoy a simple construction.

(3) According to a third feature of the present invention, there is provided a method of exchanging a plurality of component holders in an electric-component transferring apparatus which includes a holder chuck which holds each of the component holders such that the each component holder is removable therefrom, the transferring apparatus transferring an electric component held by one of the component holders that is held by the holder chuck, the method comprising the steps of preparing at least two holder holding members, causing each of the at least two holder holding members to hold at least two of the component holders such that each of the at least two component holders is allowed to be removed therefrom, causing a holding-member holding device to hold at least one of the at least two holder holding members such that the at least one holder holding member is removable therefrom, exchanging the one component holder held by the holder chuck, with another of the component holders that is held by the at least one holder holding member held by the holding-member holding device, and exchanging the at least one holder holding member held by the holding-member holding device, with at least one of the holder holding members that is not held by the holding-member holding device, so that the at least two component holders held by the at least one holder holding member that is held by the holding-member holding device are exchanged with the at least two component holders held by the at least one holder holding member that is not held by the holding-member holding device. At least one of the two or more holder holding members may be held by the holding-member holding device, so that the component holder held by the holder chuck may be exchanged with one of the component holders that is held by the at least one holder holding member held by the holding-member holding device, and at least one different one of the two or more holder holding members may be kept at a position away from the holding-member holding device. An operator may exchange one or more component holders held by the holder holding member or members kept away from the holding device, with one or more different component holders which is or are needed for mounting ECs on a different sort of PCBs. In the latter case, when the EC transferring apparatus needs the one or more different component holders, the one or more holder holding members held by the holding-member holding device is or are exchanged with the one or more holder holding members kept away from the holding device. Thus, a plurality of component holders are simultaneously exchanged with a plurality of other component holders, all at once.

(4) According to a fourth feature of the present invention that includes the third feature (3), the step of exchanging the one component holder held by the holder chuck, comprises automatically exchanging the one component holder held by the holder chuck, with the another of the component holders that is held by the at least one holder holding member held by the holding-member holding device, and the step of exchanging the at least one holder holding member held by the holding-member holding device, comprises manually exchanging the at least one holder holding member held by the holding-member holding device, with the at least one holder holding member that is not held by the holding-member holding device. Since the current component holder held by the holder chuck is automatically exchanged with one of the component holders held by the holder holding member, the automatic EC transferring operation of the EC transferring apparatus can be carried out substantially continuously. The holder holding member held by the holding-member holding device is manually exchanged with the holder holding member that is not held by the holding-member holding device, for example, when the current set-up of an EC mounting system is changed over to another set-up because the current sort of PCBs are changed over to another sort of PCBs. Changing the current set-up over to another set-up includes, e.g., changing the PCB-convey width of a PCB conveying device of the EC mounting system. Since changing the PCB-convey width is performed while the EC mounting operation is stopped, there arises no problem with the operator's manual exchanging of the holder holding members.

(5) According to a fifth feature of the present invention that includes the fourth feature (4), the step of exchanging the one component holder held by the holder chuck, comprises operating, for moving the holder chuck relative to the at least one holder holding member, a chuck moving device which is for moving the holder chuck and thereby transferring the electric component held by the one component holder held by the holder chuck. Since the holder chuck is moved relative to the holder holding member held by the holding-member holding device, by using the chuck moving device which is primarily provided for moving the holder chuck and thereby transferring the electric component held by the component holder held by the holder chuck, the cost needed for exchanging the component holders can be reduced as compared with the case where an exclusive holder-exchange moving device is employed for exchanging the component holder held by the holder chuck, with another component holder held by the holder holding member.

(6) According to a sixth feature of the present invention that includes the fifth feature (5), the step of exchanging the one component holder held by the holder chuck, further comprises moving the holding-member holding device to move the at least one holder holding member held thereby, relative to the holder chuck. There are some cases where the movement of the holder chuck by the chuck moving device does not suffice for exchanging the component holders. Even in those cases, it may be possible to exchange the component holders by utilizing additionally the movement of the holding-member holding device, without modifying the chuck moving device.

(7) According to a seventh feature of the present invention, there is provided an apparatus for exchanging a plurality of component holders in an electric-component transferring apparatus which includes a holder chuck which holds each of the component holders such that the each component holder is removable therefrom, the transferring apparatus transferring an electric component held by one of the component holders that is held by the holder chuck, the apparatus comprising at least one holder holding member which holds at least two of the component holders such that each of the at least two component holders is allowed to be removed therefrom; and a holding-member holding device which holds the holder holding member such that the holder holding member is removable therefrom. The holder holding member is removably held by the holding-member holding device. Therefore, the plurality of component holders held by the holder holding member can be simultaneously exchanged with a plurality of necessary component holders, by exchanging the holder holding member held by the holding-member holding device, with another holder holding member holding the plurality of necessary component holders.

(8) According to an eighth feature of the present invention that includes the seventh feature (7), the holding-member holding device holds the holder holding member such that the holder holding member is removable therefrom without using any tools. Since the holder holding member is holdable to, and removable from, the holdingmember holding device, without having to use any tools, the holder holding member can be easily and quickly attached to, and detachable from, the holding device. However, the holder holding member may be attached to, and detached from, the holding device, with the help of a fixing member or device, such as a bolt and a nut, which involves the use of a tool such as a wrench.

(9) According to a ninth feature of the present invention that includes the eighth feature (8), the holding-member holding device comprises a holding-member supporting member having a holding-member supporting surface which supports a supported surface of the holder holding member; a positioning device which positions the holder holding member in a direction parallel to the holding-member supporting surface; and a moving-away preventing device which prevents the holder holding member from moving away from the holding-member supporting surface.

(10) According to a tenth feature of the present invention that includes the ninth feature (9), the positioning device comprises a stopper which engages two portions of the holder holding member that are distant from each other in a direction parallel to the supported surface, and which inhibits translation of the holder holding member in a direction in which the holder holding member engages the stopper, and inhibits rotation of the holder holding member in a direction parallel to the supported surface; and a parallel-direction biasing device which biases the holder holding member toward the stopper in a direction parallel to the holding-member supporting surface.

(11) According to an eleventh feature of the present invention that includes the tenth feature (10), the moving-away preventing device comprises a moving-away preventing member which engages, in vicinity of the stopper, an engagement surface of the holder holding member that is opposite to the supported surface thereof; and a perpendicular-direction biasing device which applies, in a direction in which the supported surface of the holder holding member is moved toward the holding-member supporting surface, a biasing force to one of opposite end portions of the holder holding member that is opposite to the other end portion thereof which engages the stopper.

(12) According to a twelfth feature of the present invention that includes the eleventh feature (11), the stopper and the moving-away preventing member are integral with each other.

(13) According to a thirteenth feature of the present invention that includes the twelfth feature (12), the stopper and the moving-away preventing member comprise two headed pins which are fixed to the holding-member supporting member at two positions which are distant from each other in a direction parallel to the holding-member supporting surface, and the two portions and the engagement surface of the holder holding member comprise two notches which are formed in the holder holding member and which engage respective axial portions of the two headed pins, and two surfaces which surround the two notches, respectively. The notches may be U-shaped or V-shaped. It is preferred that the two notches be ones which inhibit, in the state in which the two notches are engaged with the respective axial portions of the two headed pins, the holder holding member from being translated in a direction in which the two notches are distant from each other and in a direction in which the notches approach the pins when the notches engage the respective axial portions of the same.

(14) According to a fourteenth feature of the present invention that includes any one of the eleventh to thirteenth features (11) to (13), the parallel-direction biasing device and the perpendicular-direction biasing device are provided by a single biasing device which produces a biasing force having a first direction component to bias the holder holding member toward the stopper and a second direction component to bias the holder holding member toward the holding-member supporting surface.

(15) According to a fifteenth feature of the present invention that includes the fourteenth feature (14), the single biasing device comprises a main member which is attached to one of the holding-member supporting member and the holder holding member, an engaging member which disengageably engages an engageable portion of the other of the holding-member supporting member and the holder holding member, and an elastic member which is provided between the main member and the engaging member. The main member, the engaging member, and the elastic member may be provided on the holding-member holding member, and the engageable portion may be provided on the holder holding member, or vice versa. In the former case, a smaller number of element or elements is or are provided on the holder holding member, and accordingly the present exchanging apparatus enjoys a lower cost than an exchanging apparatus in which each of a plurality of holder holding members is selected and used with a single holding-member holding device, and is provided with its own main member, engaging member, and elastic member.

(16) According to a sixteenth feature of the present invention that includes any one of the seventh to fifteenth features (7) to (15), the exchanging apparatus further comprises a holder-removal inhibiting member which is attached to the holder holding member such that the holder-removal inhibiting member is movable to an operative position thereof where the inhibiting member inhibits each of the component holders from being removed from the holder holding member and to an inoperative position thereof where the inhibiting member allows the each component holder to be removed from the holder holding member; and an inhibiting-member moving device which moves the holder-removal inhibiting member to each of the operative and inoperative positions thereof. The explanation made for the second feature (2) applies to the present, sixteenth feature (16).

(17) According to a seventeenth feature of the present invention that includes the sixteenth feature (16), the exchanging apparatus further comprise an inhibiting-member biasing device which is provided between the holder holding member and the holder-removal inhibiting member and which biases the holder-removal inhibiting member to the operative position thereof. In the state in which the holder holding member is not held by the holding-member holding device, the holder-removal inhibiting member is held at its operative position by the biasing force of the inhibiting-member biasing device. Therefore, the inhibiting member inhibits each of the component holders held by the holder holding member from being removed from the same. That is, since the component holders are prevented from coming off the holder holding member even in the state in which the holding member is not held by the holding-member holding device, the operator can easily handle the holding member.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Hereinafter, there will be described an electric-component ("EC") mounting system 10 including two EC transferring and mounting apparatuses 20, 22 to which the present invention is applied. The two EC transferring and mounting apparatuses 20, 22 include respective suction-nozzle exchanging devices 190, 192 to which the present invention is also applied. Each of the suction-nozzle exchanging devices 190, 192 carries out a suction-nozzle exchanging method to which the present invention is also applied.

Figure 1:
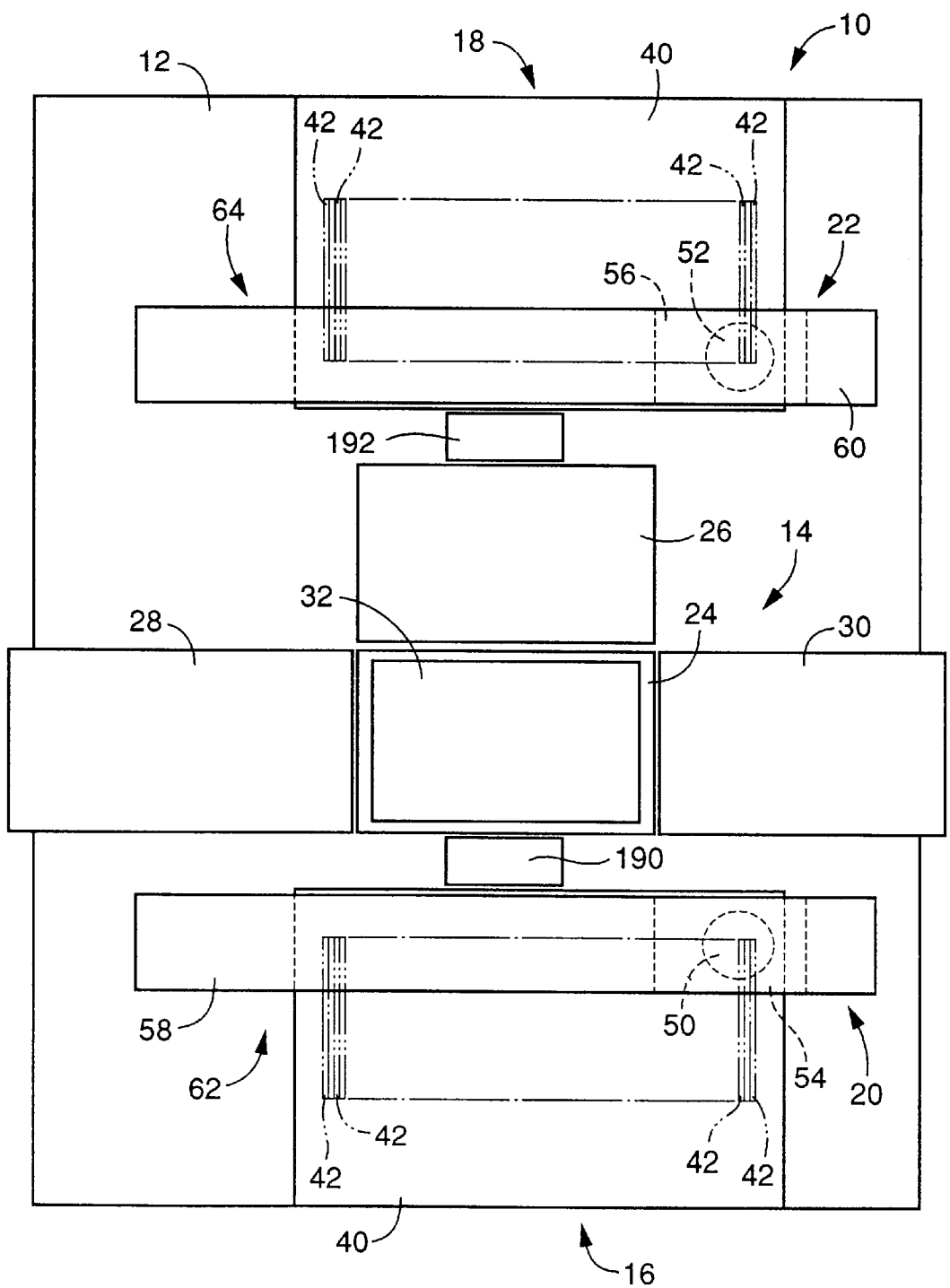
FIG. 1 is a schematic plan view of an electric-component ("EC") mounting system including an EC transferring and mounting apparatus which embodies the present invention and which includes a suction-nozzle exchanging device which embodies the present invention and carries out a suction-nozzle exchanging method which embodies the present invention.

The EC mounting system 10, shown in FIG. 1, is part of an electric-circuit assembly line which includes, in addition to the EC mounting system 10, a screen printing system (not shown) as an upstream-side device provided on an upstream side of the EC mounting system 10 in a direction in which a circuit substrate ("CS") is conveyed, and a solder reflowing system (not shown) as a downstream-side device provided on a downstream side of the EC mounting system 10. The screen printing system is a sort of solder-paste applying system which applies solder paste to the CS, that is, prints the solder paste on the CS, for providing a printed circuit board ("PCB") 32 on which ECs 86 are mounted by the EC mounting system 10. The solder reflowing system reflows or melts the solder paste printed on the CS and electrically connects the ECs 86 to the PCB 32.

The EC mounting system 10 will be described below.

In FIG. 1, reference numeral 12 designates a base on which a PCB conveying device 14, two EC supplying devices 16, 18, and the two EC transferring and mounting apparatuses 20, 22 are provided. The PCB conveying device 14 and the EC supplying devices 16, 18 have the same constructions as those of the PCB conveying device and the EC supplying devices which are disclosed in U.S. patent application Ser. No. 08/979,828 assigned to the Assignee of the present application. In addition, the EC transferring and mounting apparatuses 20, 22, except the suction-nozzle exchanging devices 190, 192 thereof, have the same constructions as those of the EC mounting devices disclosed in the above-indicated U.S. Patent Application. Therefore, only relevant portions of the devices or apparatuses 14, 16, 18, 20, 22 will be described below before the suction-nozzle exchanging devices 190, 192 are described.

The PCB conveying device 14 includes two main conveyors 24, 26, a single carry-in conveyor 28, and a single carry-out conveyor 30. The two main conveyors 24, 26 include respective PCB positioning and supporting devices each of which positions and supports the PCB 32, and are juxtaposed, that is, arranged side by side, in a direction (i.e., Y-axis direction) which is perpendicular, on a horizontal plane, to a direction (i.e., X-axis direction) in which the PCB 32 is conveyed. The X-axis direction will be referred as the "PCB-convey direction", if appropriate. The X-axis direction, i.e., the PCB-convey direction is the direction from the left-hand side to the right-hand side in FIG. 1.

The carry-in conveyor 28 is provided on the upstream side of the main conveyors 24, 26 in the PCB-convey direction, and is shifted by a carry-in-conveyor shifting device (not shown) to a first shift position where the carry-in conveyor 28 is aligned with the first main conveyor 24 and to a second shift position where the carry-in conveyor 28 is aligned with the second main conveyor 26. The carry-in conveyor 28 receives, from the screen printing device, the PCB 32 on which the solder paste has been screen-printed by the printing device, and carries in the PCB 32 to the first or second main conveyor 24, 26.

The carry-out conveyor 30 is provided on the downstream side of the main conveyors 24, 26 in the PCB-convey direction, and is shifted by a carry-out-conveyor shifting device (not shown) to a first shift position where the carry-out conveyor 30 is aligned with the first main conveyor 24 and to a second shift position where the carry-out conveyor 30 is aligned with the second main conveyor 26. The carry-out conveyor 30 receives, from the first or second main conveyor 24, 26, the PCB 32 on which the ECs have been mounted by the EC transferring and mounting apparatuses 20, 22, and carries out the PCB 32 to the paste reflowing system.

Each of the EC supplying devices 16, 18 includes a plurality of EC feeders 42 each of which is detachably attached to a feeder-support table 40. Each of the EC feeders 42 includes a tape feeding device which feeds a plurality of ECs 86 in the form of an EC carrier tape and supplies the ECs 86 one by one to an EC-supply portion of the each feeder 42. The plurality of EC feeders 42 are attached to the feeder-support table 40 such that the respective EC-supply portions of the EC feeders 42 are arranged along a straight line parallel to the X-axis direction.

The EC transferring and mounting apparatuses 20, 22 include respective EC mounting heads 50, 52, and respective X-Y robots 62, 64 which include respective X-axis slides 54, 56 and respective Y-axis slides 58, 60 and which move the respective EC mounting heads 50, 60 to respective arbitrary positions on a horizontal plane. Since the two EC mounting heads 50, 52 have the same construction and the two X-Y robots 62, 64 have the same construction, only the EC mounting head 50 and the X-Y robot 62 will be described below.

The Y-axis slide 58 is provided on the base 12 such that the Y-axis slide 58 is movable in the Y-axis direction, and the X-axis slide 54 is provided on the Y-axis slide 58 such that the X-axis slide 54 is movable in the X-axis direction. The Y-axis slide 58 is moved in the Y-axis direction by a Y-axis-slide moving device including a Y-axis servomotor 65 (FIG. 17) as a drive source and a motion converting device which converts the rotation of the Y-axis servomotor 65 into linear motion and transmits the linear motion to the Y-axis slide 58. Similarly, the X-axis slide 54 is moved in the X-axis direction by an X-axis-slide moving device including an X-axis servomotor 66 (FIG. 17) as a drive source and a motion converting device which converts the rotation of the X-axis servomotor 66 into linear motion and transmits the linear motion to the X-axis slide 54.

The EC mounting head 50 includes an intermittent-rotation body 68 (FIG. 2) which is attached to the X-axis slide 54 such that the intermittent-rotation body 68 is intermittently rotatable about a vertical axis line. The intermittent-rotation body 68 is rotated by an arbitrary angle in each of opposite directions by a rotating device including a rotating servomotor 70 (FIG. 17) as a drive source. Each of the above-described three servomotors 65, 66, 70 is an electric rotary motor as a sort of electric motor and is accurately controllable with respect to its rotation angle and speed. The servomotors 65, 66, 70 may be replaced with stepper motors.

Figure 2:
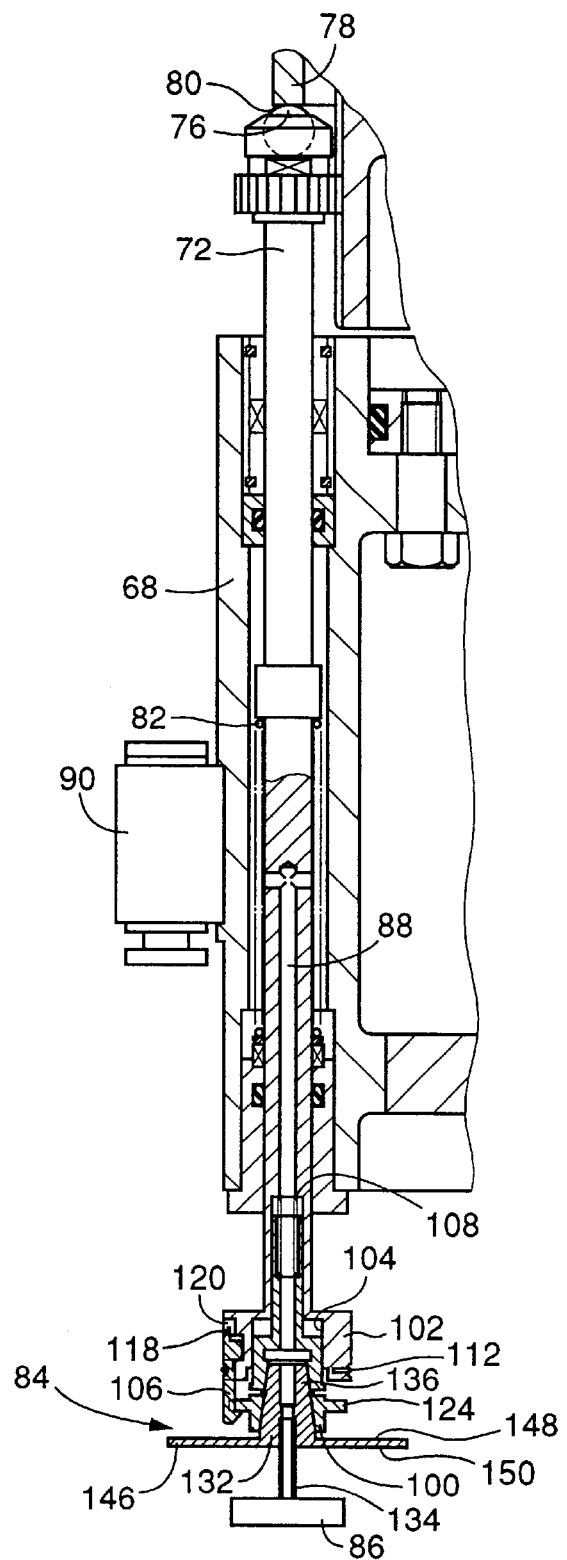
FIG. 2 is a front cross-section view of a relevant portion of an intermittent-rotation body as part of the EC transferring and mounting apparatus of FIG. 1.

The intermittent-rotation body 68 supports a plurality of shaft members 72 (sixteen shaft members 72 in the present embodiment; only one shaft member 72 is shown in FIG. 2), such that the plurality of shaft members 72 are equiangularly spaced from one another about the axis line of rotation of the body 68. The shaft members 72 are fitted in respective holes formed through the rotation body 68 such that the shaft members 72 are movable in respective axial directions parallel to the axis line of rotation of the body 68 and are rotatable about their own axis lines. When the rotation body 68 is rotated, the sixteen shaft members 72 are revolved about the axis line of rotation of the body 68.

As shown in FIG. 2, a spherical cam follower 76 is rotatably attached to an upper end of each of the shaft members 72. Each shaft member 72 is biased upward by a compression coil spring 82, as an elastic member as a sort of biasing device, which is provided between the rotation body 68 and the each shaft member 72. Thus, the cam follower 76 is forcedly contacted with a cam surface 80 of a stationary cam 78 fixed to the X-axis slide 54. The cam surface 80 includes a height-position-variable portion whose height position is continuously variable in a circumferential direction thereof, and a height-position-constant portion whose height position is constant in the same direction. Since the respective cam followers 76 of the sixteen shaft members 72 follow or roll on the cam surface 80 when the rotation body 68 is rotated, the shaft members 72 are moved up and down while being revolved around the axis line of rotation of the body 68.

The sixteen shaft members 72 carry, at respective lower end portions thereof projecting downward from the rotation body 68, respective EC suction nozzles 84 as component holders. Each of the EC suction nozzle 84 sucks and holds an EC 86 by applying negative air pressure or vacuum to the EC 86. Each suction nozzle 84 is connected to a passage 88 formed in the corresponding shaft member 72, and a corresponding switch valve 90 attached to the rotation body 68. The switch valve 90 is connected to a vacuum source (not shown) via a passage (not shown) formed in the rotation body 68. The switch valve 90 is switched, by a switch-valve control device, to a vacuum-supply position where the valve 90 changes the air pressure in the suction nozzle 84, from a value greater than the atmospheric pressure to a negative value, thereby allowing the nozzle 84 to suck an EC 86, and to an EC-release position where the valve 90 changes the air pressure of the nozzle 84, from the negative value to the value greater than the atmospheric pressure, thereby allowing the nozzle 84 to release the EC 86. Even when the rotation body 68 is rotated, the passages formed in the rotation body 68 are kept communicated with a passage which is formed in the X-axis slide 54 and is connected to the vacuum source.

Figure 3:
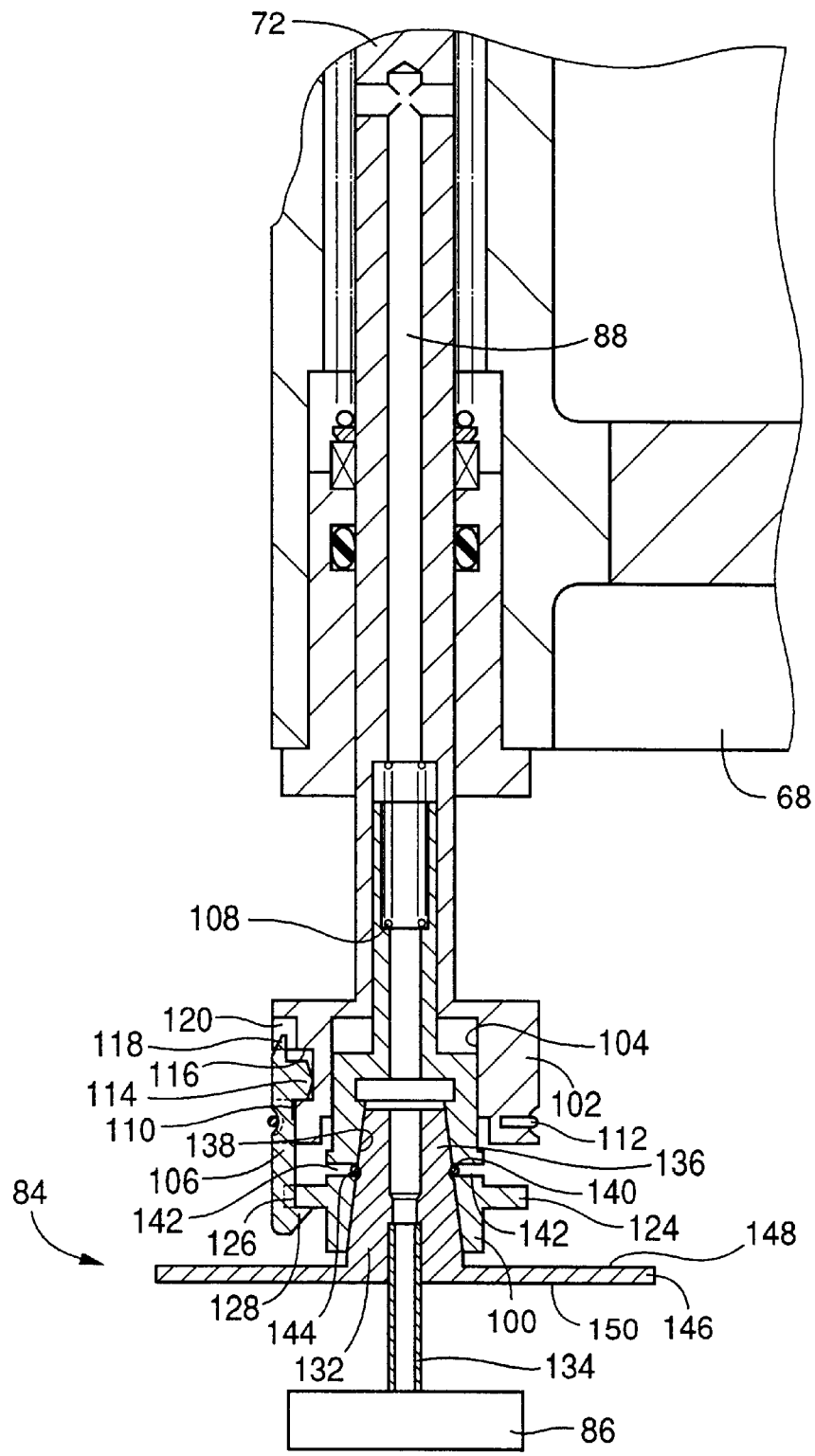
FIG. 3 is a front cross-section view of an EC suction nozzle, an adaptor, and shaft member which are attached to the intermittent-rotation body of FIG. 2.
Figure 4:
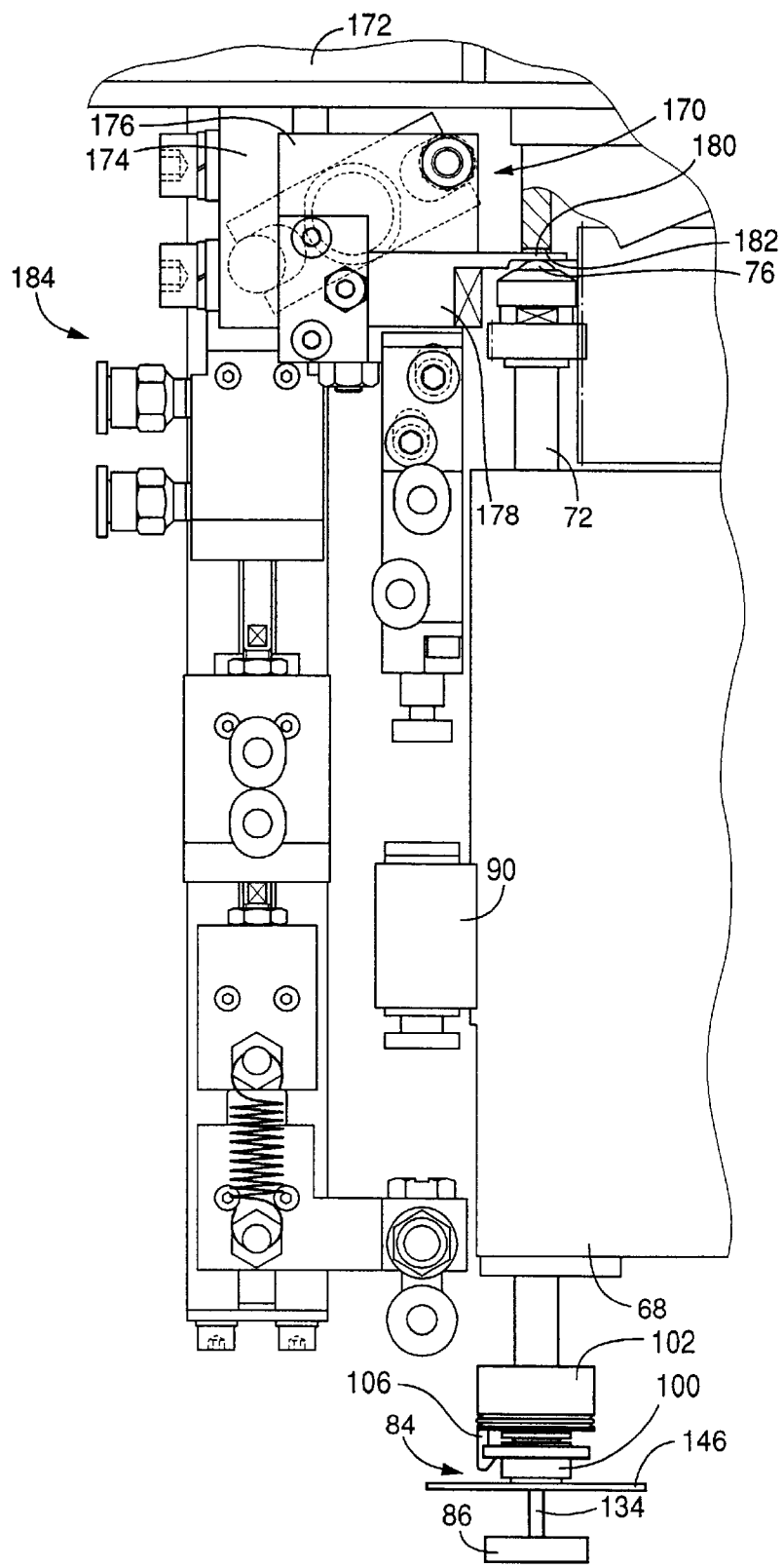
FIG. 4 is a front elevation view of an elevating and lowering device, and a mechanical portion of a switch-valve control device, each of which is part of the EC transferring and mounting apparatus of FIG. 1.

As shown in FIG. 3, each of the EC suction nozzles 84 is attached to the corresponding shaft member 72 via an adaptor 100. The adaptor 100 is fitted in a receiving hole 104 formed in a nozzle holding portion 102 provided at the lower end portion of the shaft member 72. The adaptor 100 is movable relative to the shaft member 72 in the axial direction thereof. The adaptor 100 is held by a plurality of holding members 106 (only one holding member 106 is shown in FIGS. 2, 3, and 4) which are supported by the nozzle holding portion 102 such that the plurality of holding members 106 are equiangularly spaced from each other about the axis line of rotation of the shaft member 72. The adaptor 100 is biased in a direction in which the adaptor 100 projects downward from the nozzle holding portion 102, by a compression coil spring 108 as an elastic member as a sort of biasing device.

The nozzle holding portion 102 has a plurality of grooves 110 which extend parallel to the axis line of rotation of the shaft member 72 and which are equiangularly spaced from each other about the same axis line. The holding members 106 are fitted in the grooves 110, respectively, such that the holding members 106 are pivotable in the grooves 110. The holding members 106 are supported on the nozzle holding portion 102, with the help of an annular spring member 112 which is fitted on the holding portion 102. The holding members 106 include respective projections 114 which project toward the center line of the nozzle holding portion 102 and which are fitted in respective holes 116 formed in the holding portion 102 such that each of the holding members 106 is contacted with a bottom surface of the corresponding hole 116 and is pivotable about an axis line perpendicular to a lengthwise direction thereof and tangential to a portion of the holding portion 102 to which the each holding member 106 is attached.

In addition, each holding member 106 includes an operative portion 118 which is provided above the projection 114 and is fitted in a hole 120 formed in the nozzle holding portion 102. Since the projection 114 and the operative portion 118 of each holding member 106 are fitted in the holes 110, 120 of the nozzle holding portion 102, respectively, the each holding member 106 is prevented from being pivoted about an axis line perpendicularly intersects the axis line of rotation of the shaft member 72.

A lower portion of each of the holding members 106 is fitted in a corresponding one of a plurality of holes 126 formed in a large-diameter engaging portion 124 of the adaptor 100. Thus, the adaptor 100 is prevented from being rotated relative to the nozzle holding portion 102. Each holding member 106 has an engaging projection 128 which projects from a lower end portion thereof toward the adaptor 100 and which is engageable with a lower surface of the large-diameter engaging portion 124. Thus, the adaptor 100 is prevented from coming out of the receiving hole 104 of the nozzle holding portion 102. In the state in which the respective engaging projections 128 of the holding members 106 are disengaged from the engaging portion 124 of the adaptor 100, by pushing the operative portions 118 of the holding members 106 and thereby pivoting the holding members 106 against the biasing force of the spring member 112, the adaptor 100 can be removed from the nozzle holding portion 102 of the shaft member 72.

Each of the EC suction nozzles 84 includes a pipe holding member 132, and a suction pipe 134 held by the holding member 132. The pipe holding member 132 includes a tapered portion 136 as a fitted portion which is fitted in a tapered hole 138 as a receiving hole which is formed in the adaptor 100. The pipe holding member 132 is supported on the adaptor 100 with the help of a generally U-shaped spring member 140. Two arm portions of the spring member 140 are fitted in two grooves 142 formed in the adaptor 100, respectively. The distance between the two arm portions decreases in a direction toward respective free ends of the arm portions, and respective free-end portions of the two arm portions are bent toward each other. Thus, the spring member 140 is prevented from coming off the adaptor 100.

In the state in which the tapered portion 136 is fitted in the tapered hole 138, the spring member 140 is fitted in an annular groove 144 formed in an outer surface of the tapered portion 136. Thus, the spring member 140 engages the tapered portion 136, thereby holding the pipe holding member 132. In addition, the spring member 140 draws the tapered portion 136 of the pipe holding member 132, into the tapered hole 138 of the adaptor 100. Thus, the pipe holding member 132 is positioned relative to the adaptor 100. The spring member 140 is fitted in the annular groove 144 such that a center of a circular cross section of the spring member 140 is not aligned with a center of a semi-circular cross section of the groove 144, that is, is positioned slightly above the center of the semi-circular cross section. Therefore, the spring member 140 engages an upper portion of the groove 144, thereby drawing the pipe holding member 132 into the tapered hole 138. The EC suction nozzle 84 can be removed from the adaptor 100, by applying, to the nozzle 84, a force greater than the nozzle drawing force of the spring member 140, in a direction in which the nozzle 84 is moved away from the adaptor 100. In the present embodiment, the adaptors 100 provide nozzle chucks as a sort of component chucks. The adaptors 100 are detachably attached to the shaft members 72 as chuck holding members. It can be said that the shaft members 72 hold the EC suction nozzles 84 via the adaptors 100, respectively. Reference numeral 146 designates a disc-like light emitting plate which is formed of aluminum and has a high degree of reflectance.

An upper surface of the plate 146 functions as a light reflecting surface 148. A layer formed of a luminescent material is formed on a lower surface 150 of the plate 146 from which the suction pipe 134 projects. The luminescent layer absorbs an ultraviolet light and emits a visible light toward the EC 86.

The intermittent-rotation body 68 is intermittently rotated at an intermittent-rotation angular pitch equal to a spacing angular pitch at which the sixteen shaft members 72 are equiangularly spaced from one another about the axis line of rotation of the body 68. When the rotation body 68 is intermittently rotated, the sixteen shaft members 72 (and the adaptors 100 and the EC suction nozzles 84) are sequentially stopped at sixteen stop positions. One of the sixteen stop positions that corresponds to the lowest position of the cam surface 80 is an EC-suck-and-mount position where the EC suction nozzles 84 receives ECs 86 from the EC supplying device 16 and mounts the ECs 86 on the PCB 32. One of the sixteen stop positions that corresponds to the highest position of the cam surface 80 and is angularly spaced by 180 degrees from the EC-suck-and-mount position is an EC-image-take position. The cam surface 80 is so formed that the shaft members 72 (and the EC suction nozzles 84) are moved horizontally before and after each of the EC-suck-and-mount position and the EC-image-take position. The cam surface 80 is provided such that the EC-suck-and-mount position is positioned on a straight line which passes through the axis line of rotation of the rotation body 68 and is parallel to the X-axis direction. One of the sixteen shaft members 72 that is positioned at the EC-suck-and-mount position is positioned at the lowest position, and the respective height positions of the other shaft members 72 increases toward the EC-image-take position in each of opposite circumferential directions of the cam surface 80. The respective height positions of two shaft members 72 adjacent to, and on both sides of, the shaft member 72 being positioned at the EC-suck-and-mount position are level with, or slightly higher than, that of the shaft member 72 being positioned at the EC-suck-and-mount position. An EC-image taking device 160 (FIG. 17) is provided at a position on the X-axis slide 54 that corresponds to the EC-image-take position. In addition, a reference-mark-image taking device 162 (FIG. 17) which takes respective images of a plurality of reference marks affixed to the PCB 32 is provided on the X-axis slide 54.

As shown in FIG. 4, an elevating and lowering device 170 which elevates and lowers each of the shaft members 72 (i.e., the adaptors 100) is provided at a position on the X-axis slide 54 that corresponds to the EC-suck-and-mount position. The elevating and lowering device 170 includes a linear motor 172 as a drive source. The linear motor 172 is a servomotor that is a sort of electric motor and is accurately controllable with respect to its moving distance and speed. The servomotor 172 may be replaced with a stepper motor. The linear motor 172 includes a housing and a movable portion 174 which projects vertically downward from the housing and to which a movable member 176 is fixed. A drive member 178 is fixed to the movable member 176, and includes a drive portion 180 like a thin plate. The drive portion 180 is fitted in a recess 182 formed in a portion of the stationary cam 78 that corresponds to the EC-suck-and-mount position. The drive portion 180 is movable up and down in the recess 182.

When the movable member 176 is moved up and down by the linear motor 172, the drive member 178 is moved up and down between an upper stroke end position where the drive portion 180 is fitted in the recess 182 such that a lower surface of the drive portion 180 is aligned or flush with the cam surface 80, and the drive portion 180 provides part of the stationary cam 78, and a lower stroke end position where the drive portion 180 is not aligned with the recess 182 and the lower surface thereof is positioned below the cam surface 80. From the state in which one shaft member 72 is stopped at the EC-suck-and-mount position by the rotation of the intermittent-rotation body 68 and the cam follower 76 thereof is engaged with the lower surface of the drive portion 180, the movable member 176 is lowered and accordingly the drive member 178 is lowered, so that the drive portion 180 is lowered. Consequently the shaft member 72 and the adaptor 100 are also lowered (if the EC suction nozzle 84 is held by the adaptor 100, the nozzle 84 is also lowered). When the movable member 176 is elevated and accordingly the drive member 178 is elevated, the drive portion 180 is also elevated. Consequently the shaft member 72 and the adaptor 100 are also elevated to follow the drive portion 180, owing to the biasing force of the compression coil spring 82. The distance of upward or downward movement of the drive member 178, that is, the shaft member 72 can be adjusted by controlling the linear motor 172 and thereby adjusting the distance of movement of the movable member 176. A mechanical portion 184 of the switch-valve control device that switches the switch valve 90 in timed relation with the upward or downward movement of the drive member 178, is provided at a position that is on the X-axis slide 54 in the vicinity of the EC-suck-and-mount position. However, no description of the mechanical portion is provided. In addition, a nozzle rotating device as a holder rotating device which rotates each shaft member 72 about its own axis line and thereby rotates the EC suction nozzle 84 about its own axis line is provided on the X-axis slide 54 and the each shaft member 72. The nozzle rotating device corrects an angular error of the EC 86 held by the nozzle 84 or changes a current angular position of the EC 86 to a predetermined angular position. However, no description of the nozzle rotating device is provided.

As shown in FIG. 1, the first suction-nozzle exchanging device 190 is provided between the first main conveyor 24 of the PCB conveyor 14 and the first EC supplying device 16, and the second suction-nozzle exchanging device 192 is provided between the second main conveyor 26 of the PCB conveyor 14 and the second EC supplying device 18. Since the two suction-nozzle exchanging devices 190, 192 have the same construction, the exchanging device 190 will be described as a representative of the two devices 190, 912.

Figure 5:
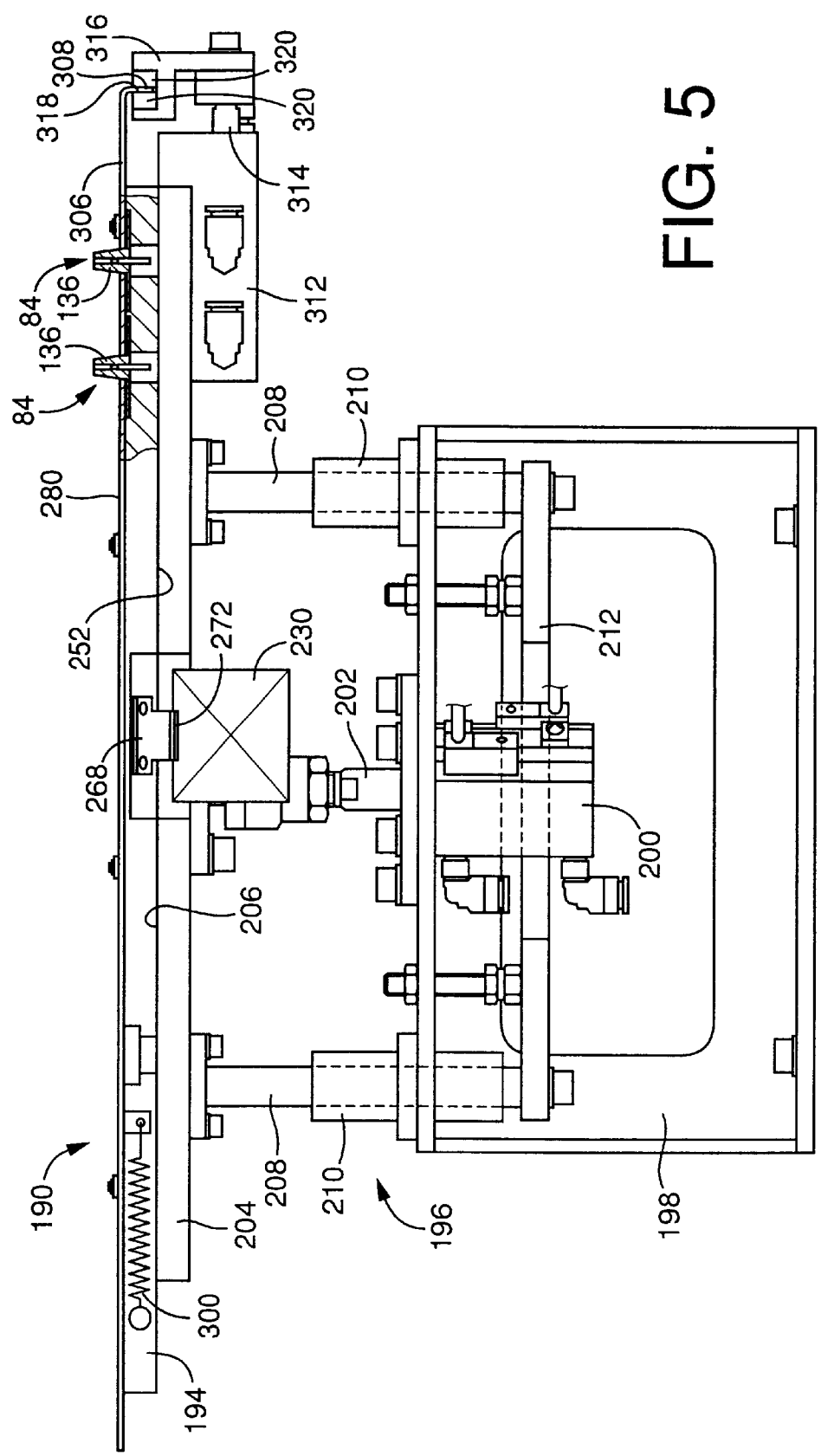
FIG. 5 is a partly cross-sectioned, front elevation view of the suction-nozzle exchanging device of FIG. 1.
Figure 6:
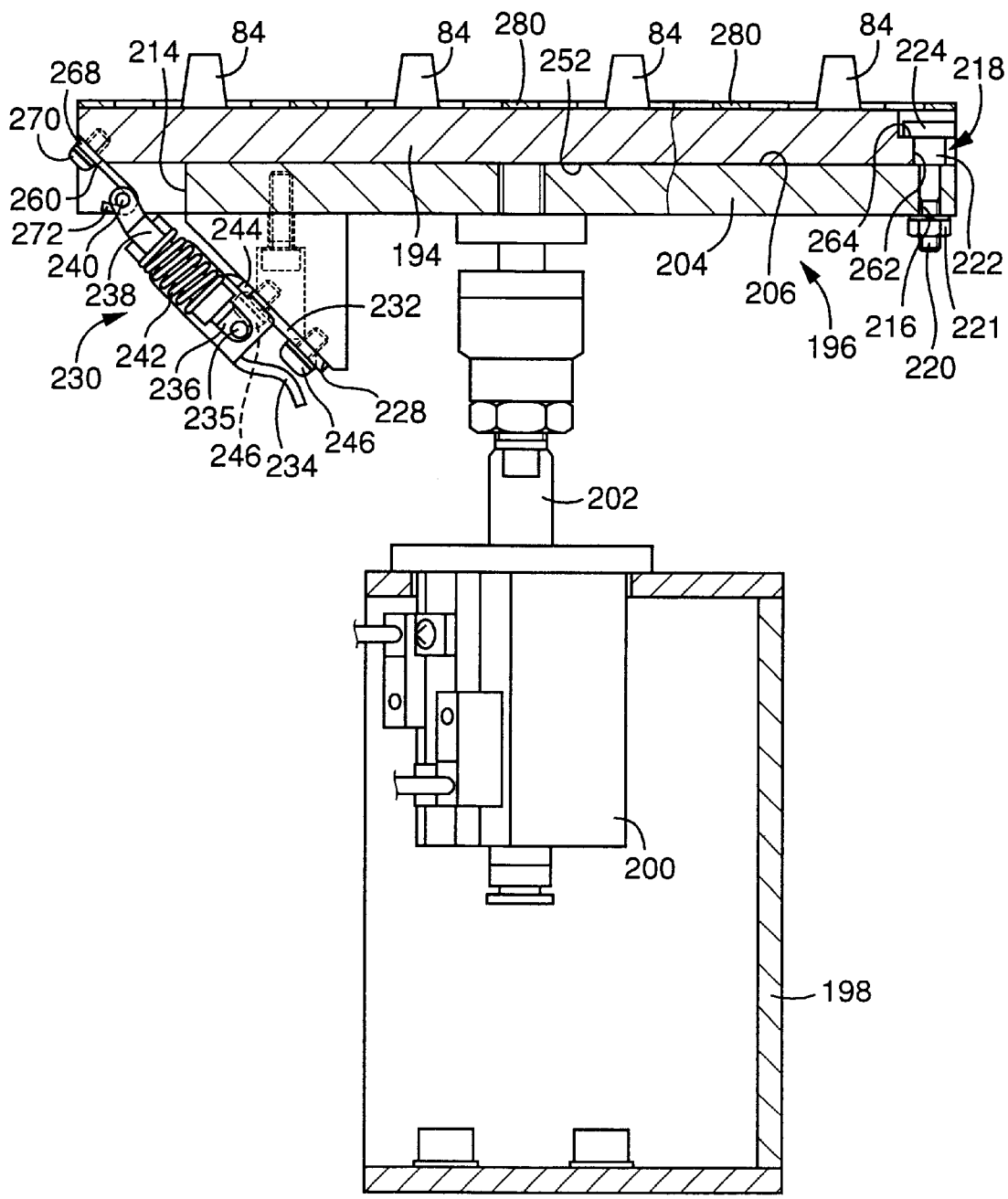
FIG. 6 is a side elevation view of the suction-nozzle exchanging device of FIG. 5.

As shown in FIG. 5, the suction-nozzle exchanging device 190 includes a nozzle holding member 194 as a holder holding member, and a holding-member holding device 196. The holding-member holding device 196 includes a frame 198 fixed to the base 12 that is not shown in FIG. 5. A pressurized-air-operated cylinder device (hereinafter referred to as the "air cylinder") 200 as as a pressurized-fluid-operated cylinder device as a sort of pressurized-fluid-operated actuator is fixed to the frame 198 such that the air cylinder 200 is oriented upward. As shown in FIGS. 5 and 6, a plate-like holding-member supporting member 204 is fixed to an upper end of a piston rod 202 of the air cylinder 200, such that the supporting member 204 extends horizontally. An upper surface of the supporting member 204 defines a holding-member supporting surface 206. Two guide rods 208 as guide members are fixed to a lower surface of the supporting member 204 are fitted in two guide cylinders 210 fixed to the frame 198, such that the guide rods 208 are movable up and down. Respective lower end portions of the two guide rods 208 that project downward from the guide cylinders 210 are connected to each other by a connecting member 212. When a solenoid-operated direction control valve 213 (FIG. 17) is switched, two air chambers of the air cylinder 200 which are currently communicated with the atmosphere and a pressurized-air supplying source, respectively, are communicated with the pressurized-air supplying source and the atmosphere, respectively, so that the piston rod 202 is moved up or down. Consequently the holding-member supporting member 204 is moved up or down while keeping its horizontal posture and being guided by the guide rods 208 and the guide cylinders 210. The air cylinder provides a holding-member elevating and lowering device as a sort of holding-member moving device.

Figure 7:
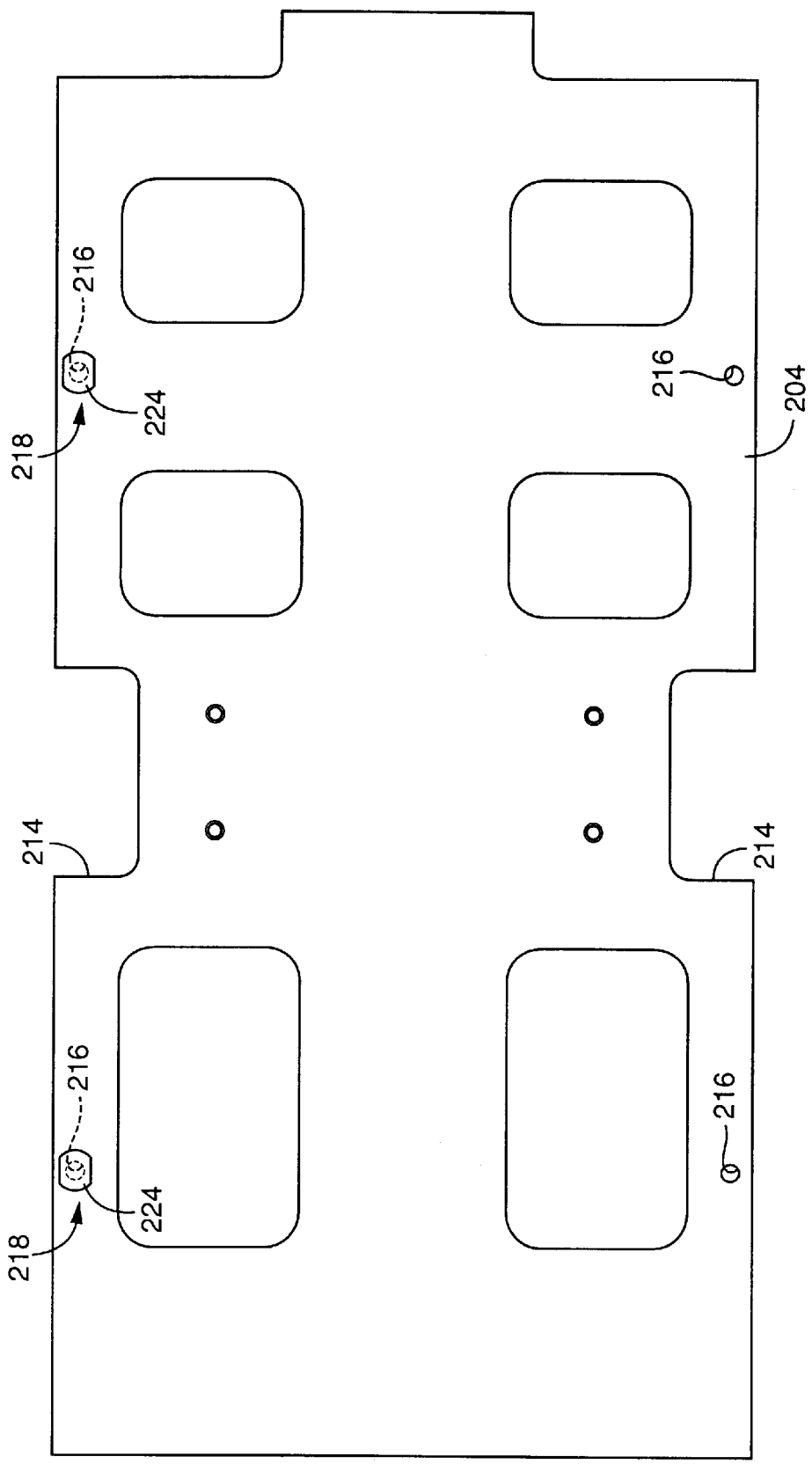
FIG. 7 is a plan view of a holding-member supporting member as part of the suction-nozzle exchanging device of FIG. 5.

The suction-nozzle exchanging device 190 is provided such that a lengthwise direction of the holding-member supporting member 204 is parallel to the PCB-convey direction, i.e., the X-axis direction. As shown in FIGS. 6 and 7, the supporting member 204 has two recesses 214 which are formed, through the thickness thereof, in respective portions thereof that are widthwise opposite to each other and are lengthwise middle. Two through-holes 216 are formed through the thickness of the supporting member 204, on both sides of each of the two recesses 214 in the lengthwise direction of the supporting member 204. Two headed pins 218 include respective externally threaded portions 220 which are fitted in the two through-holes 216, respectively, which are formed in one of the widthwise opposite end portions of the supporting member 204 that is nearer to the PCB conveyor 14 than the other widthwise end portion. Two nuts 221 are externally threaded with respective free end portions of the respective threaded portions 220 of the two headed pins 218 that project downward from the supporting member 204. Thus, the two headed pins 218 are fastened to the supporting member 204 such that the two pins 218 are distant from each other in a direction parallel to the holding-member supporting surface 206 and extend perpendicularly to the supporting surface 206. The two headed pins 218 additionally include respective intermediate portions 222 each having a circular cross section. The maximum amount of external threading of each nut 221 with the corresponding headed pin 218 is defined by butting of the intermediate portion 222 of the pin 218 against the supporting surface 206. Thus, a space is provided between the supporting surface 206 and a head portion 224 which is provided opposite to the threaded portion 220 with respect to the intermediate portion 222. As shown in FIG. 7, Diametrically opposite portions of the head portion 224 are chamfered, i.e., cut away, and a rotating tool is engageable with the head portion 224.

As shown in FIG. 6, the holding-member supporting member 204 has two inclined surfaces 228 (only one inclined surface 228 is shown in FIG. 6) which are provided at respective positions corresponding to the two recesses 214, on a back-surface side of the member 204 that is opposite to the holding-member supporting surface 206. The two inclined surfaces 228 are inclined by 45 degrees with respect to the supporting surface 206. As shown in FIGS. 5 and 6, a fastening device 230 is attached to one of the two inclined surfaces 228 that corresponds to the other widthwise end portion which is opposite to the two headed pins 218, i.e., is nearer to the EC supplying device 16 than the above-indicated one widthwise end portion with which the headed pins 218 are engaged.

Figure 8:
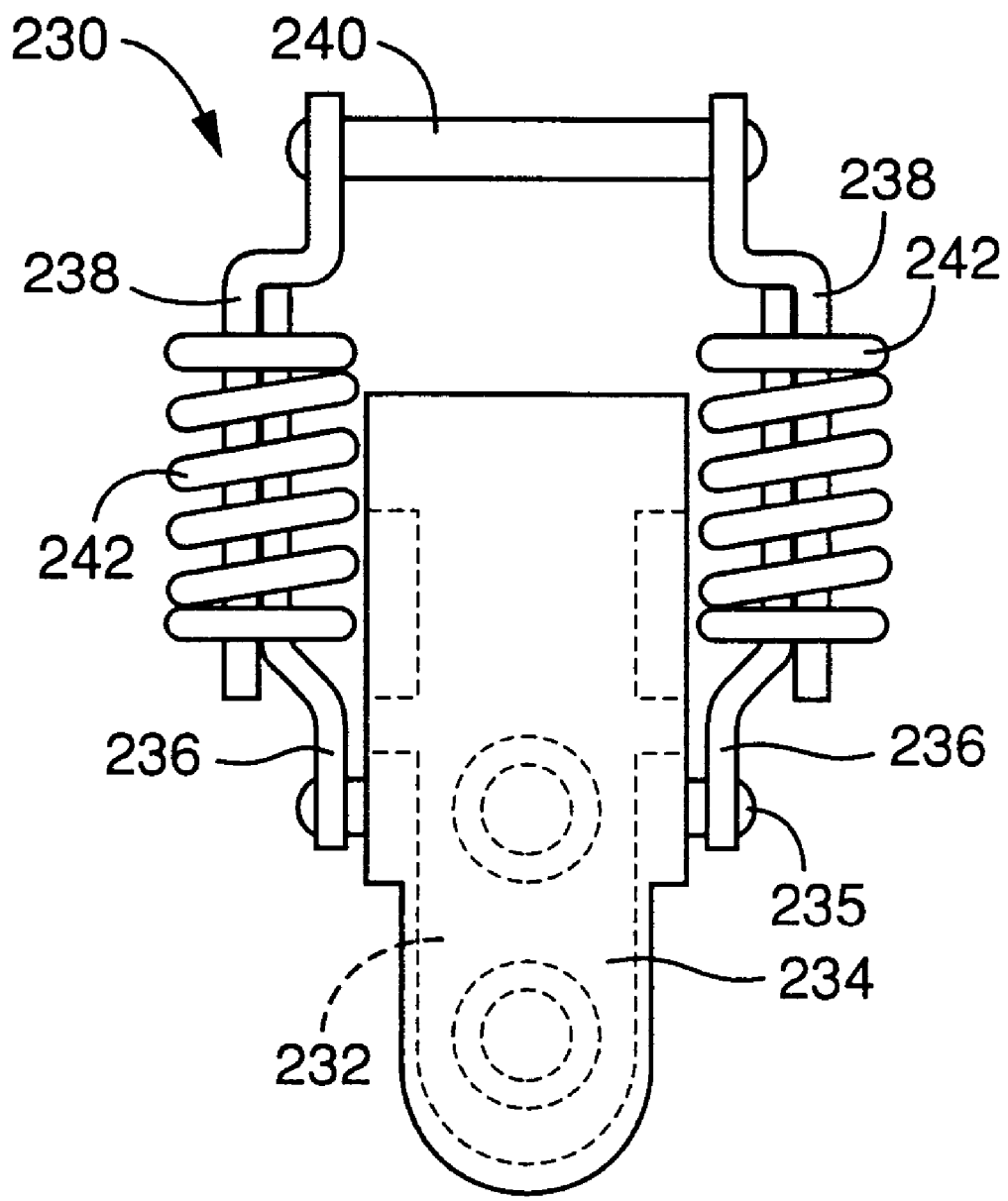
FIG. 8 is a front elevation view of a fastening device which is supported by the holding-member supporting member of FIG. 7.

As shown in FIGS. 6 and 8, the fastening device 230 includes a main member 232; a lever 234 which is attached to the main member 232 such that the lever 234 is pivotable relative to the main member 232 about an axis line parallel to a widthwise direction of the main member 232; a pair of arms 236 which are attached via an axis member 235 to the lever 234 such that the pair of arms 236 are pivotable about the axis member 235 extending parallel to the axis line about which the lever 234 is pivotable relative to the main member 232; a second pair of arms 238 which are engaged with the first pair of arms 236 such that the second pair of arms 238 are movable relative to the first pair of arms 236 in respective lengthwise directions of the arms 236 and are not pivotable relative to the arms 236; an engaging member 240 which connects between respective end portions of the second pair of arms 238 that are not aligned with the first pair of arms 236; two compression coil springs 242 as elastic members as a sort of biasing devices that are provided between the two first arms 236 and the two second arms 238, respectively; and a stopper 244 (FIG. 6) which is supported by the main member 232 and which defines the maximum amount of pivotal motion of the lever 234 relative to the main member 232. Opposite end portions of each of the two coil springs 242 are engaged with the corresponding ones of the first and second pairs of arms 236, 238, so that each coil spring 242 biases the corresponding first and second arms 236, 238 toward each other in a direction parallel to the inclined surface 228. The main member 232 of the fastening device 230 is fixed to the inclined surface 228 with bolts 246 as a sort of fixing device, such that the fastening device 230 is inclined by 45 degrees relative to the supporting surface 206.

Figure 9:
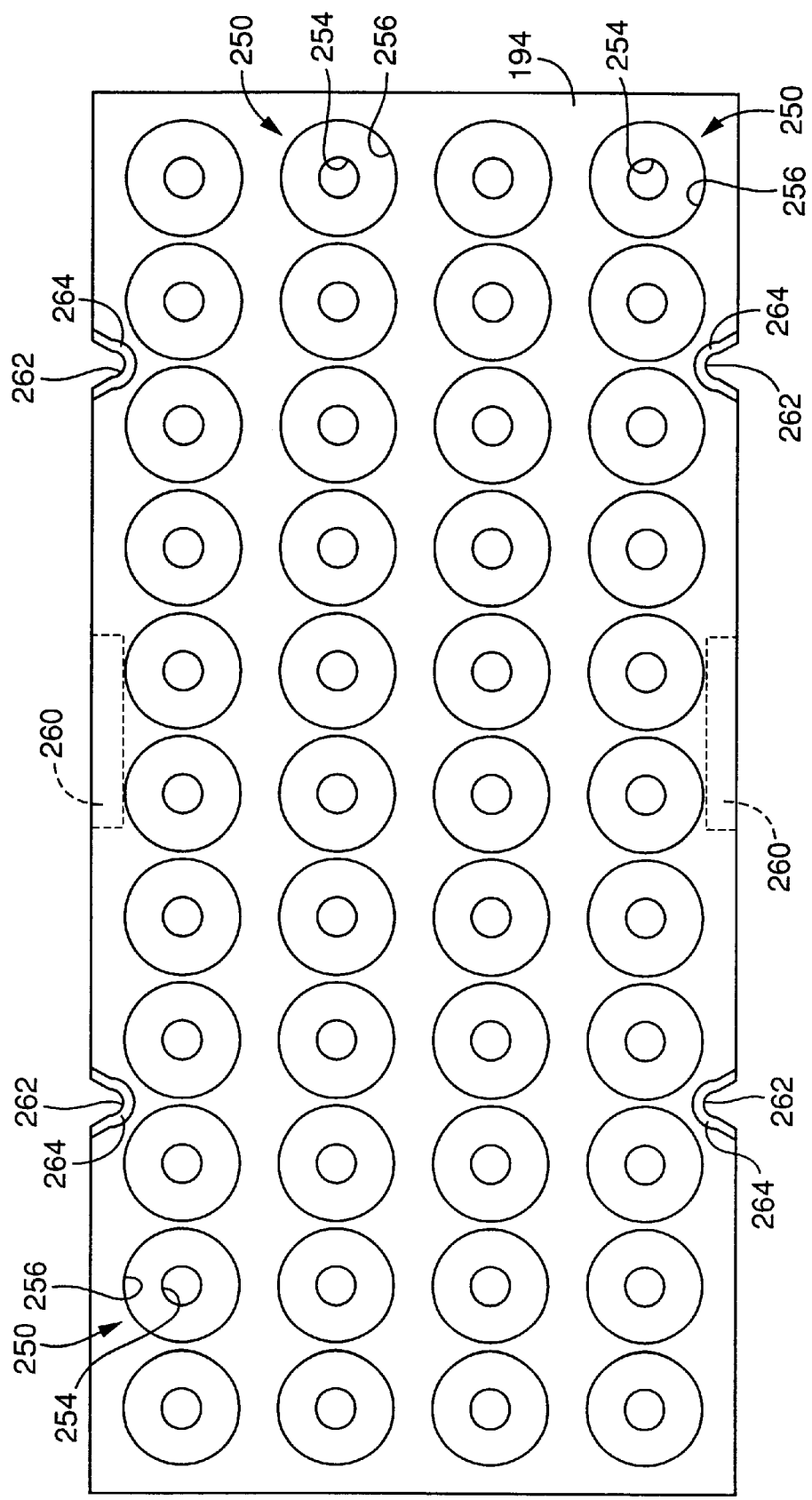
FIG. 9 is a plan view of a nozzle holding member as part of the suction-nozzle exchanging device of FIG. 5.
Figure 10:
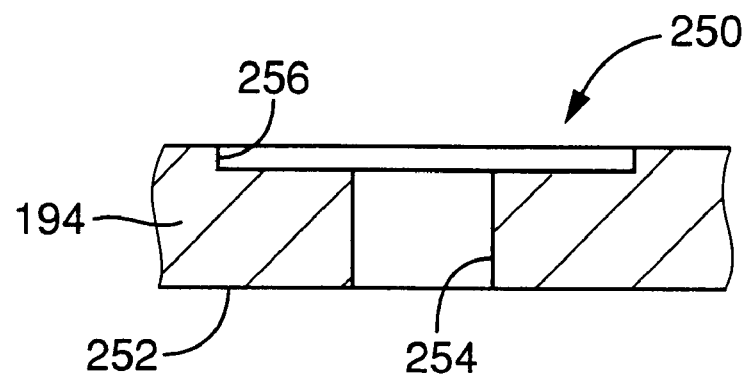
FIG. 10 is a front cross-section view of a nozzle-holding hole of the nozzle holding member of FIG. 9.

The nozzle holding member 194 is detachably attached to the holding-member supporting member 204, without using any tools, and is moved up and down with the supporting member 204. As shown in FIGS. 5 and 9, the nozzle holding member 194 has a generally rectangular plate-like shape, and has a plurality of stepped, nozzle holding holes 250. As shown in FIGS. 9 and 10, each of the nozzle holding holes 250 includes a small-diameter portion 254 which opens in a supported surface 252 of the holding member 194 that is supported on the holding-member supporting member 204; and a large-diameter portion 256 which opens in an opposite surface of the holding member 204 that is opposite to the supported surface 252. The holes 250 are formed at a regular interval in each of a widthwise and a lengthwise direction of the holding member 194. The large-diameter portion 256 of each nozzle holding hole 250 has a depth greater than the thickness of the light emitting plate 146 of each EC suction nozzle 84. The holding-member supporting member 204 is colored in black, to decrease its degree of reflectance.

Figure 12:
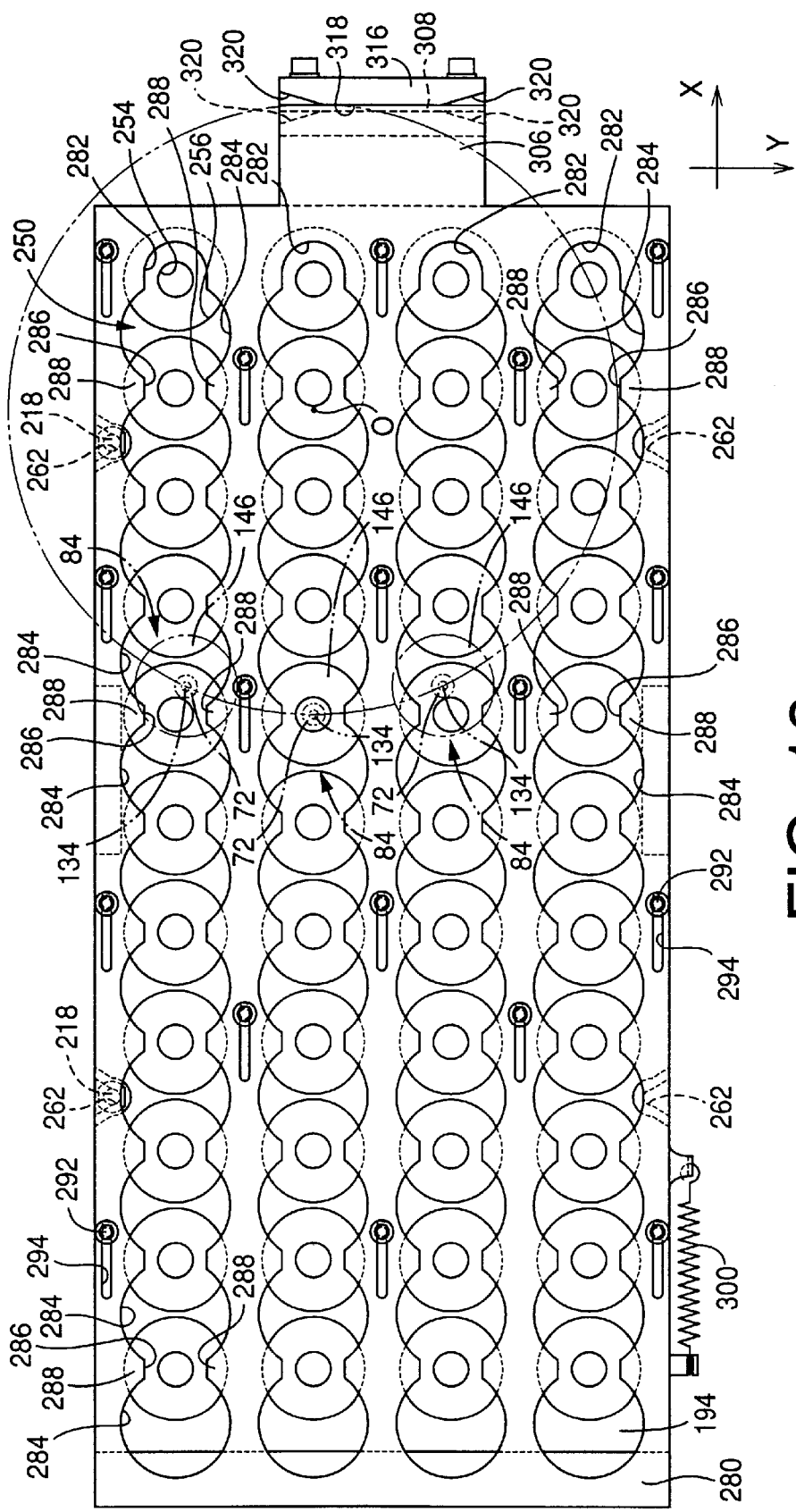
FIG. 12 is a plan view of the nozzle holding member of FIG. 9 together with a nozzle-removal inhibiting plate which is in its operative position.
Figure 13:
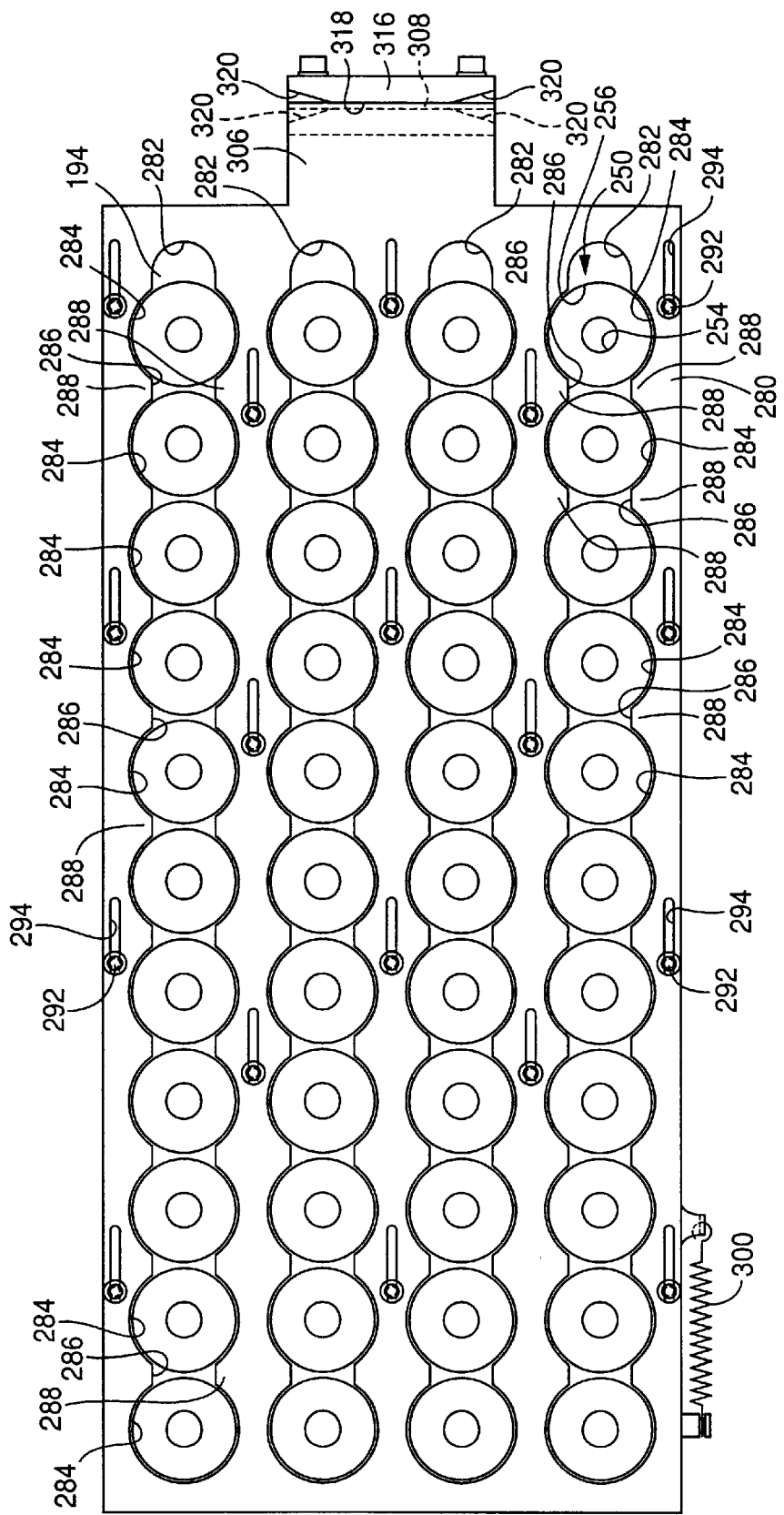
FIG. 13 is a plan view of the nozzle holding member of FIG. 9 together with the nozzle-removal inhibiting plate which is in its inoperative position.
Figure 14:
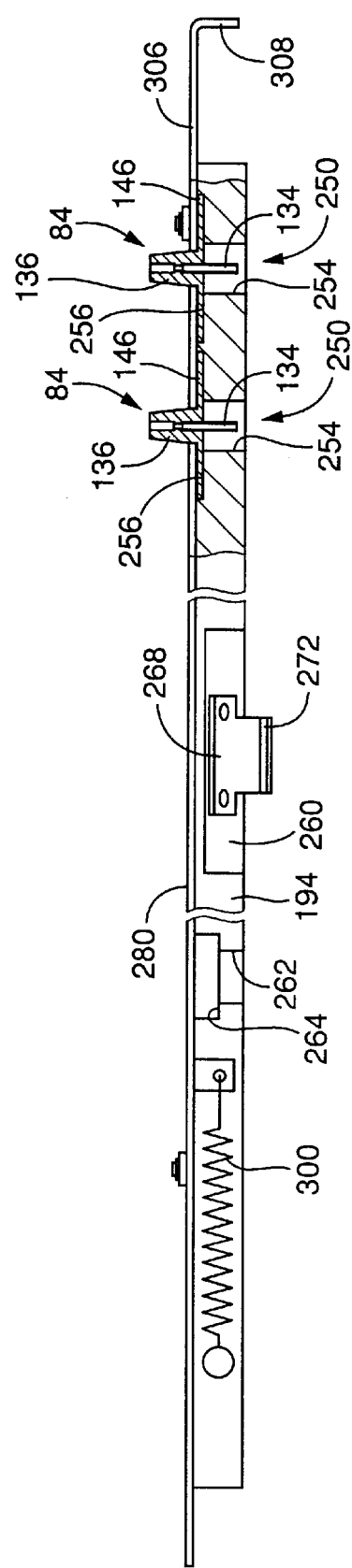
FIG. 14 is a partly cross-sectioned, front elevation view of the nozzle holding member of FIG. 9 together with the nozzle-removal inhibiting plate.

As shown in FIG. 14, an EC suction nozzle 84 is fitable in each of the nozzle holding holes 250. In FIG. 14, only two nozzles 84 are shown as representatives of all the nozzles 84. In FIGS. 12 and 13, the nozzles 84 are not shown. Each of the nozzles 84 is fitted in one nozzle holding hole 250 such that the suction pipe 134 is fitted in the small-diameter portion 254, the light emitting plate 146 is fitted in the large-diameter portion 256 and supported on a bottom wall of the same portion 256, and the tapered portion 136 of the pipe holding member 132 projects upward from the holding member 194.

In the present embodiment, a plurality of sorts of EC suction nozzles 84 are used. The respective light emitting plates 146 of the different sorts of nozzles 84 have the same diameter, but the respective suction pipes 134 of the same 84 have different diameters. An appropriate one of the different sorts of nozzles 84, that is, an appropriate one of the different sorts of suction pipes 134 is selected and used depending upon the shape and dimensions of ECs 86 to be sucked and mounted. Thus, the nozzle holding member 194 holds the different sorts of nozzles 84, such that the number of nozzles 84 of each sort is proportional to the frequency of use of the each sort of nozzles 84 and such that the nozzles 84 of each sort are placed adjacent to each other. The diameter of the respective small-diameter portions 254 of the nozzle holding holes 250 is so predetermined that the suction pipe 134 having the largest diameter can be fitted in each portion 254. The diameter of the respective large-diameter portions 254 of the nozzle holding holes 250 is so predetermined to be slightly larger than that of the light emitting plates 146 of the nozzles 84. The respective tapered portions 136 of the different sorts of nozzles 84 have the same dimensions.

Figure 11:
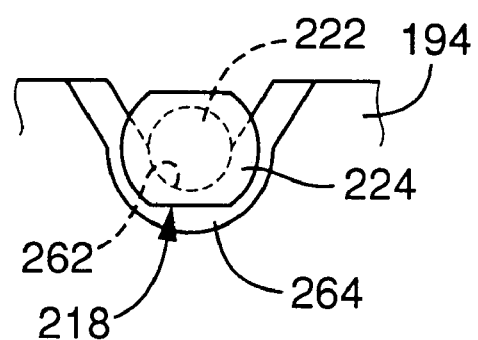
FIG. 11 is a plan view of a recess of the nozzle holding member of FIG. 9.

As shown in FIG. 9, the nozzle holding member 194 has two inclined surfaces 260 at respective positions which are widthwise opposite to each other and lengthwise middle (only one inclined surface 260 is shown in FIG. 6). Two notches 262 are formed through the thickness of the holding member 194, at respective positions which are on both sides of each inclined surface 260 in the lengthwise direction of the holding member 194 and are distant from each other in a direction parallel to the supported surface 252. The two pairs of notches 262 open in the widthwise opposite end surfaces of the holding member 194, respectively. Each of the notches 262 has a generally U-shaped cross section taken along a plane parallel to the supported surface 252, and the width of the each notch 262 increases in a direction toward its opening in the corresponding end surface of the holding member 194. As shown in FIGS. 6 and 11, each notch 262 is surrounded by a counterbore whose bottom surface defines an engaging surface 264 which is opposite to the supported surface 252.

As shown in FIG. 6, the two inclined surfaces 260 are inclined by 45 degrees with respect to the supported surface 252 such that respective lower portions of the inclined surfaces 260 are nearer to the widthwise middle of the holding member 194 than respective upper portions of the same 260. An engaging member 268 (FIGS. 6 and 14) is detachably attached with a bolt 270 (not shown in FIG. 14) as a sort of fixing device to one of the two inclined surfaces 260 that is nearer to the EC supplying device 16 in the state in which the nozzle holding member 194 is attached to the holding-member supporting member 204. Thus, the engaging member 268 is fixed to the holding member 194 such that the engaging member 268 is inclined by 450 degrees with respect to the supported surface 252. A lower end portion of the engaging member 268 projects downward from the inclined surface 260, and is bent back to have a generally V-shaped cross section. The V-shaped lower end portion of the engaging member 268 provides an engaging portion 272.

As shown in FIG. 12, an operator engages the two notches 262 which are formed in the other widthwise end portion of the nozzle holding member 194 that is opposite to the one widthwise end portion of the same 194 to which the engaging member 268 is attached, with the respective intermediate portions 222 of the two headed pins 218 projecting from the holding-member supporting member 204. Thus, the nozzle holding member 194 is prevented from being translated in the direction in which the above-indicated two notches 262 are distant from each other, being translated in a direction in which the holding member 194 is moved relative to the supporting member 204 so as to engage the two notches 262 with the two pins 218, respectively, being translated in a direction parallel to the supported surface 252, and being rotated about an axis line perpendicular to the surface 252. Simultaneously, as shown in FIGS. 6 and 11, the respective head portions 224 of the two pins 218 are engaged with the respective engaging surfaces 264 around the two notches 262, so that the holding member 194 is prevented from moving upward away from the supporting member 204. Moreover, an operator engages the engaging member 240 of the fastening device 230 with the engaging portion 272 of the engaging member 268 attached to the holding member 194, so that the holding member 194 is biased toward the headed pins 218 by the biasing force of the compression coil springs 242, in a direction parallel to the supporting surface 206, and so that the supported surface 252 is biased toward the holding-member supporting surface 206 in a direction perpendicular to the same 206. As described above, the fastening device 230 is attached to the supporting member 204 such that the fastening device 230 is inclined by 45 degrees with respect to the supporting surface 206, and accordingly the coil springs 242 are similarly inclined. Thus, the coil springs 242 produce a biasing force having a first direction component to bias the holding member 194 toward the headed pins 218 and a second direction component to bias the holding member 194 toward the supporting surface 206. The coil springs 242 provide a common biasing device which functions not only as a parallel-direction biasing device but also as a perpendicular-direction biasing device. When the operator engages the engaging portion 272 with the engaging member 240, he or she inserts the engaging portion 272 into the recess 214 of the supporting member 204, so that the engaging portion 272 is engaged with the engaging member 240 located in the recess 214.

As shown in FIGS. 12, 13, and 14, the nozzle holding member 194 is provided with a thin, nozzle-removal inhibiting plate 280 which covers the nozzle holding holes 250. The inhibiting plate 280 has four openings 282 which extend parallel to one another in a lengthwise direction of the plate 280. Each of the four openings 282 includes a plurality of circular holes 284 and a plurality of connection holes 286 each of which connects its adjacent two circular holes 284 to each other. The circular holes 284 have a diameter slightly larger than that of the large-diameter portions 256 of the nozzle holding holes 250. The circular holes 284 are formed, in the lengthwise direction of the plate 280, at a regular interval equal to that at which the holding holes 250 are formed in the lengthwise direction of the holding member 194. The connection holes 286 have a width which is larger than the largest diameter of the tapered portions 136 of the suction nozzles 84 and is smaller than the diameter of the light emitting plates 146. The width of the holes 286 is defined as a dimension in the widthwise direction of the plate 280. Each of the connection holes 286 is defined by a pair of projections which provide a pair of nozzle-removal preventing portions 288 of the plate 280. The two nozzle-removal preventing portions 288 of each pair are distant from, and opposed to, each other in the Y-axis direction, i.e., in the widthwise direction of the plate 280, i.e., in the widthwise direction of the supporting member 204. The four openings 282 are formed at a regular interval equal to that at which the nozzle holding holes 250 are formed in the widthwise direction of the holding member 194.

Figure 15:
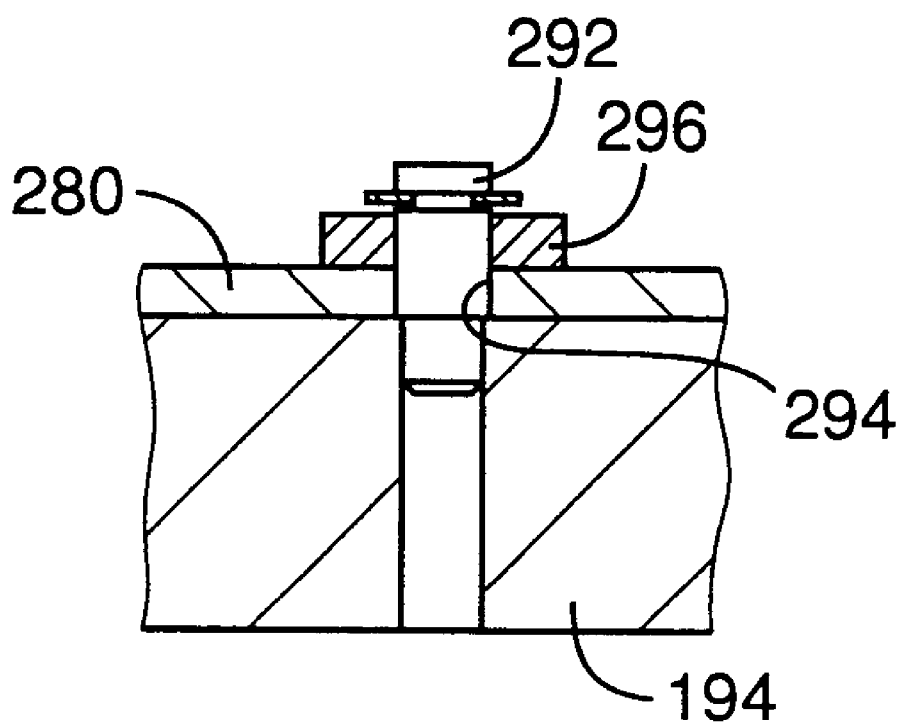
FIG. 15 is a cross-sectioned, side elevation view of a pin which projects from the nozzle holding member and which is fitted in an elongate hole of the nozzle-removal inhibiting plate.

As shown in FIGS. 12, 13, and 15, a plurality of pins 292 project from the nozzle holding member 194. Those pins 292 provide engaging projections. The nozzle-removal inhibiting plate 280 has a plurality of elongate holes 294 which are parallel to the lengthwise direction of the plate 280. The pins 292 are fitted in the elongate holes 294, respectively, such that the plate 280 is movable relative to the holding member 194. Reference numeral 296 designates a washer, in FIG. 15. The pins 292 fitted in the elongate holes 294 guide the movement of the plate 280 relative to the holding member 194, and inhibit the plate 280 from being rotated about an axis line perpendicular to the supported surface 252.

As shown in FIGS. 12 and 14, a tension coil spring 300 as an elastic member as a sort of biasing device is provided between the nozzle holding member 194 and the nozzle-removal inhibiting plate 280, such that the coil spring 300 connects the member 194 and the plate 280 to each other. The limit of movement of the plate 280 owing to the biasing force of the coil spring 300 is defined by butting of the elongate holes 294 against the pins 292. Thus, the pins 292 function as stoppers. In the state in which respective upstream-side ends of the elongate holes 294 as seen in the direction of movement of the plate 280 relative to the holding member 194 are held in butting contact with the corresponding pins 292 because of the biasing force of the coil spring 300, as shown in FIG. 12, the pairs of nozzle-removal inhibiting portions 288 of the plate 280 are positioned right above the nozzle holding holes 250, respectively, so as to inhibit the suction nozzles 84 from being removed from the nozzle holding member 194. This state corresponds to an operative position of the plate 280.

As shown in FIGS. 12, 13, and 14, the nozzle-removal inhibiting plate 280 includes a projecting portion 306 which projects from an upstream-side end of the plate 280 as seen in the direction of movement of the plate 280 because of the biasing force of the tension coil spring 300. A free end portion of the projecting portion 306 provides an engaging portion 308 which projects toward the nozzle holding member 194.

As shown in FIG. 5, an air cylinder 312 is fixed to the holding-member supporting member 204. An engaging member 316 having a recess 318 is fixed to a piston rod 314 of the air cylinder 312. The engaging portion 308 of the nozzle-removal inhibiting plate 280 is fitted in the recess 318 such that the engaging portion 308 is movable relative to the recess 318. Thus, the recess 318 is a sort of engaging portion. As shown in FIGS. 5 and 12, the recess 318 is formed through the thickness of the engaging member 316 in a direction which is perpendicular to the direction of advancing and retracting movement of the piston rod 314 and is parallel to the direction in which the holding member 194 is attached to the supporting member 204 (i.e., in the widthwise direction of the supporting member 204). As shown in FIG. 12, two pairs of opposed surfaces each pair of which define a corresponding one of lengthwise opposite end portions of the recess 318 are so inclined that the width of the each end portion of the recess 318 increases in a direction toward a corresponding one of opposite side surfaces of the engaging member 316. The two pairs of opposed surfaces provide two pairs of guide surfaces 320.

The air cylinder 312 is attached to the holding-member supporting member 204 at a position which assures that the engaging portion 308 and the recess 318 are engaged with each other in the state in which the nozzle-removal inhibiting plate 280 is held at its operative position and the piston rod 314 is held at its retracted position. However, since the two pairs of guide surfaces 320 are formed in the lengthwise opposite end portions of the recess 318, respectively, the engaging portion 308 can be engaged with the recess 318 by being guided by the guide surfaces 320, even though the engaging portion 308 may not be accurately aligned with the recess 318 in the lengthwise direction of the plate 280, i.e., in the direction of movement of the plate 280 relative to the holding member 194. The air cylinder 312 is attached to the supporting member 204, with a bias toward a misalignment of the recess 318 relative to the engaging portion 308 in a direction opposite to a direction toward the supporting member 204, i.e., opposite to a biasing direction of the tension coil spring 300.

When a solenoid-operated direction control valve 322 (FIG. 17) is switched, two air chambers of the air cylinder 312 are communicated with the atmosphere and the pressurized-air supply source, respectively, so that the piston rod 314 is advanced or retracted and the engaging member 316 is moved. Consequently the nozzle-removal inhibiting plate 280 is moved, in a direction parallel to the PCB-convey direction, between its operative position shown in FIG. 12 and its inoperative position, shown in FIG. 13, where the circular holes 284 of the openings 282 are substantially aligned with the nozzle holding holes 250 and allow each of the suction nozzles 84 to be removed from the nozzle holding member 194. The nozzle-removal inhibiting plate 280 is moved by the air cylinder 312 to its inoperative position against the biasing force of the tension coil spring 300. The nozzle-removal inhibiting plate 280 provides a nozzle-removal inhibiting member; the air cylinder 312 provides a moving device which moves the nozzle-removal inhibiting member; and the tension coil spring 300 provides a biasing device which biases the nozzle-removal inhibiting member. The engaging member 316 is provided with a pair of guide members which are fitted in a pair of guide bushings, respectively, with which the air cylinder 312 is provided. The pair of guide members and the pair of guide bushings cooperate with each other to guide the movement of the engaging member 316 relative to the air cylinder 312 and inhibit the rotation of the member 316.

A nozzle sensor 324 (FIG. 16) is provided at a position on the X-axis slide 54 that corresponds to the EC-suck-and-mount position. The X-axis slide 54 includes a support portion (not shown) which supports a lower end portion of an axis member as part of the intermittent-rotation body 68 about which the body 68 is rotatable. The nozzle sensor 324 is supported by the support portion. The support portion extends between respective positions outside and inside the locus of revolution of the shaft members 72.

Figure 16:
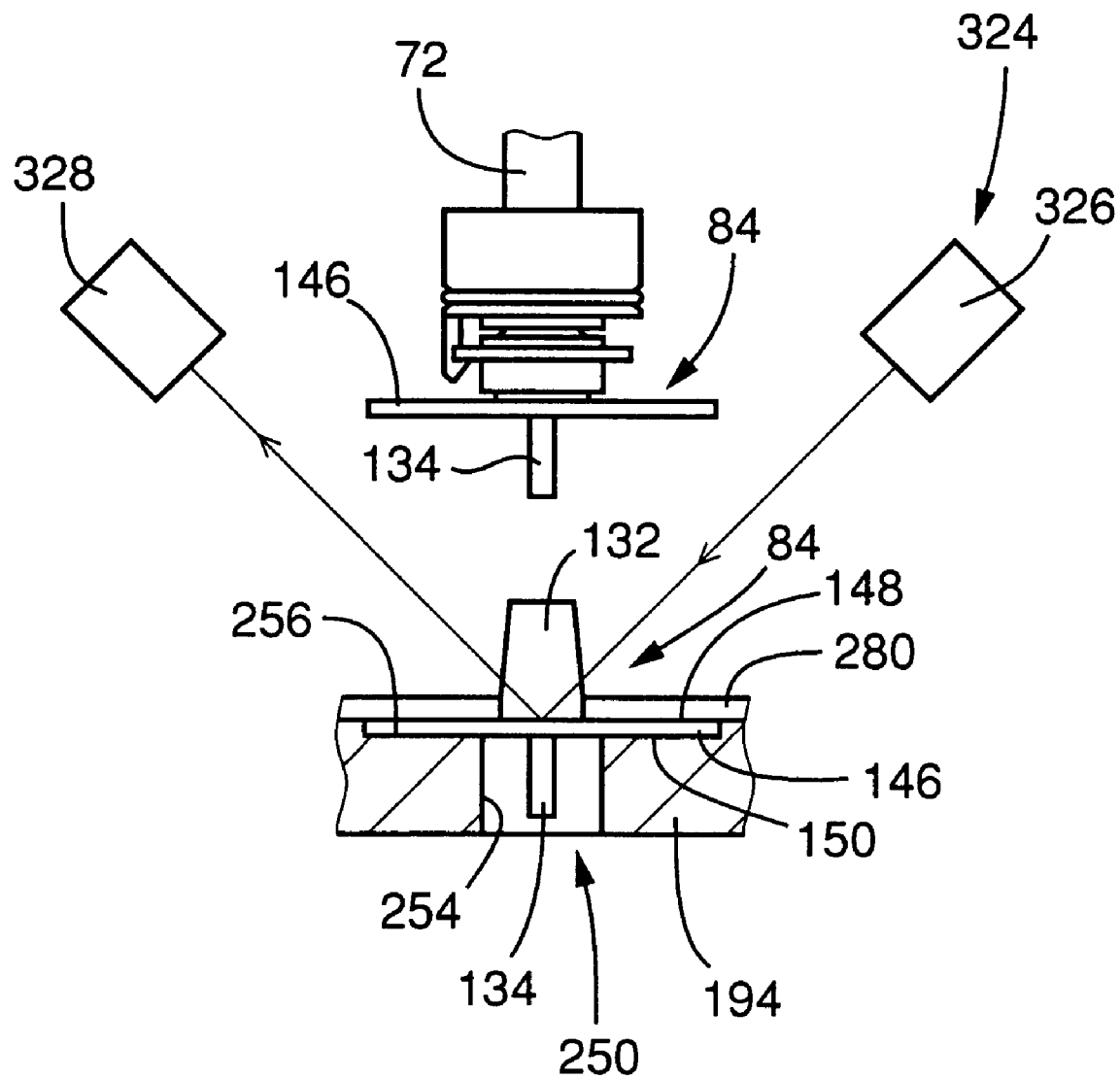
FIG. 16 is a schematic front view of a nozzle sensor which is supported by an X-axis slide as part of the EC transferring and mounting apparatus of FIG. 1.

The nozzle sensor 324 is supported by the support portion such that the sensor 324 is positioned inside the locus of revolution of the shaft members 72. As shown in FIG. 16, the nozzle sensor 324 is of a reflection type, i.e., includes a light emitter 326 and a light receiver 328. On a vertical plane parallel to the Y-axis direction, the light emitter 326 emits a light, and the light receiver 328 receives or detects the light. More specifically described, the shaft member 72 which is positioned at the EC-suck-and-mount position is moved, for exchanging the current nozzle 84 with another nozzle 84, to a position above an appropriate one of the nozzle holding holes 250 of the nozzle holding member 194. In this state, the nozzle holding member 194 and the holding-member supporting member 204 are held at their lower stroke-end positions. If the one nozzle holding hole 250 is holding one EC suction nozzle 84, the light emitter 326 emits a light toward a portion of the reflecting surface 148 of the light emitting plate 146 of the one nozzle 84 that is not covered with any pairs of nozzle-removal inhibiting portions 288 of the plate 280 being positioned at its operative position, and the light receiver 238 receives the light reflected from that portion of the reflecting surface 148. The one nozzle 84 carried by the shaft member 72 being positioned at the EC-suck-and-mount position does not interrupt the light emitted from the light emitter toward the reflecting surface 148, or the light reflected from the reflecting surface 148 toward the light receiver 238.

If the one nozzle holding hole 250 is holding one EC suction nozzle 84, the light emitted from the light emitter 326 is reflected by the reflecting surface 148, and then is received by the light receiver 238. Accordingly, the amount of light received by the light receiver 238 exceeds a predetermined threshold value. Thus, a control device 330 (FIG. 17) recognizes that the one nozzle holding hole 250 is holding one EC suction nozzle 84. However, if not, the light emitted from the light emitter 326 is incident to the large-diameter portion 256 of the one nozzle holding hole 250. Since the nozzle holding member 194 is colored in black, the amount of light reflected from the portion 256 is small and the amount of light received by the light receiver 238 cannot exceed the threshold value. Thus, the control device 330 recognizes that the one nozzle holding hole 250 is holding no EC suction nozzle 84, i.e. is empty.

In the present EC mounting system 10, the two EC supplying devices 16, 18 and the two EC transferring and mounting apparatuses 20, 22 are constructed such that the two devices 16, 18, or the two apparatuses 20, 22, are symmetric with each other with respect to the center line of the PCB conveyor 14 that is parallel to the PCB-convey direction. That is, the two devices 16, 18, or the two apparatuses 20, 22 are oriented to the same direction parallel to the PCB-convey direction. This is true with the two suction-nozzle exchanging devices 190, 192. That is, the device 192 is symmetric with the above-described device 190. For example, respective positions in the device 192 where two headed pins 218 and a fastening device 230 are attached to a holding-member supporting member 204, an engaging member 268 is attached to a nozzle holding member 194, and two notches 262 are engaged with the two headed pins 218, respectively, are symmetric with those in the device 190 with respect to the center line of the PCB conveyor 14. However, the holding-member supporting member 204 of each of the two devices 190, 192 has the two pairs of through-holes 216 and the two inclined surfaces 228 which are formed in the widthwise opposite end portions thereof, respectively. The two headed pins 218 can be supported by each pair of through-holes 216, and the fastening device 230 can be attached to each inclined surface 228. The nozzle holding member 194 of each of the two devices 190, 192 has the two pairs of notches 262 and the two inclined surfaces 260 which are formed in the widthwise opposite end portions thereof, respectively. The two headed pins 218 can be engaged with each pair of notches 262, and the engaging member 268 can be attached to each inclined surface 260. Thus, the supporting member 204 and the holding member 194 can be commonly used to the two suction-nozzle exchanging devices 190, 192 which are symmetric with each other.

Figure 17:
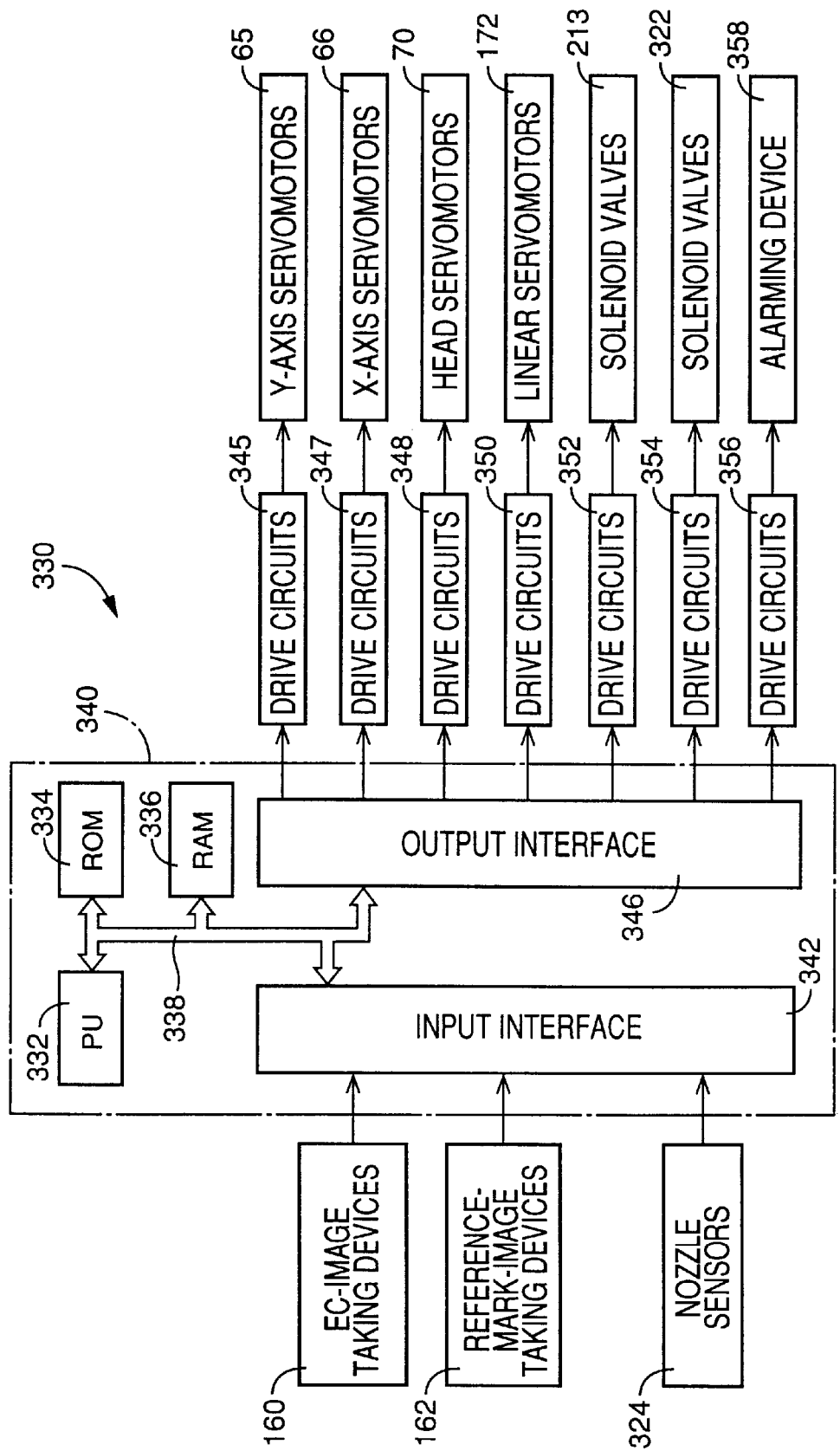
FIG. 17 is a block diagram of a relevant portion of a control device of the EC mounting system of FIG. 1.

The present EC mounting system 10 is controlled by the control device 330 shown in FIG. 17. The control device 330 is essentially constituted by a computer 340 including a processing unit (PU) 332, a read only memory (ROM) 334, a random access memory (RAM) 336, and a bus 338 which connects the elements 332, 334, 336 to one another. An input interface 342 is connected to the bus 338, and the two EC-image taking devices 160, the two reference-mark-image taking devices 162, and the two nozzle sensors 324 (or the two light receivers 328) are connected to the input interface 342. The bus 338 is connected to an output interface 346 which in turn is connected via respective drive circuits 345, 347, 348, 350, 352, 354, 356 to the two Y-axis servomotors, the two X-axis servomotors 66, the two head servomotors 70, the two linear servomotors 172, the two solenoid valves 213, the two solenoid valves 322, and an alarming device 358. The alarming device 358 informs the operator of the occurrence of an abnormality. The control device 330 additionally controls the above-described carry-in-conveyor shifting device, the carry-out-conveyor shifting device, the two main conveyors 24, 26, the carry-in conveyor 28, the carry-out conveyor 30, the respective tape feeding devices of the EC feeders 42, etc., though not shown in FIG. 17.

Hereinafter, there will be described the operation of the EC mounting system 10 constructed as described above.

The two EC transferring and mounting apparatuses 20, 22 alternately mount the ECs 86 on the PCB 32 positioned by either one of the two main conveyors 24, 26. That is, the two apparatuses 20, 22 cooperate with each other to mount, on each single PCB 32, all the ECs 86 that are to be mounted on that PCB 32 by the present EC mounting system 10. While the ECs 86 are mounted on one PCB 32 positioned and supported by one of the two main conveyors 24, 26, another or PCB 32 is carried out from the other main conveyor and a third PCB 32 is carried in onto the other main conveyor and is positioned and supported by the same. The third PCB 32 waits on the other main conveyor, for ECs 86 to be mounted thereon. After all the ECs 86 have been mounted on the first PCB 32 supported the one main conveyor, the first PCB 32 is carried out from the one main conveyor and the apparatuses 20, 22 start mounting ECs 86 on the third PCB 32 waiting on the other main conveyor.

The first EC transferring and mounting apparatus 20 takes ECs 86 from the first EC supplying device 16, and is the second apparatus 22 takes ECs 86 from the second device 18, but the first apparatus 20 does not take any ECs 86 from the second device 18 and the second apparatus 22 does not take any ECs 86 from the first device 18. The EC taking and mounting operations carried out by the first apparatus 20 will be described below as a representative of those carried out by the two apparatuses 20, 22.

When ECs 86 are taken from the first EC supplying device 16, the intermittent-rotation body 68 is intermittently rotated, so that the sixteen shaft members 72 with the respective adaptors 100 are sequentially positioned at the EC-suck-and-mount position, while the rotation body 68 is moved by the X-Y robot 62 to a position right above the EC-supply portion of an appropriate one of the EC feeders 42. When each shaft member 72 reaches the EC-suck-and-mount position, first, the cam follower 76 thereof engages the lower surface of the drive portion 180 and, in this state, the linear motor 172 is started to lower the movable member 176 and the drive member 178, thereby lowering the shaft member 72. After the EC suction nozzle 84 contacts an EC 86 and sucks the EC 86 by applying vacuum thereto, the movable member 176 and the drive member 178 are moved up so that the shaft member 72 is moved up against the biasing force of the compression coil spring 82. Thus, the suction nozzle 84 takes the EC 86 from the one EC feeder 42.

After each of the sixteen EC suction nozzles 84 takes an EC 86 at the EC-suck-and-mount position, the each nozzle 84 reaches the EC-image-take position where the EC-image taking device 160 takes an image of the EC 86 held by the each nozzle 84. After all the nozzles 84 suck and hold respective ECs 86, the EC mounting head 50 is moved by the X-Y robot 62 to above the PCB 32 and mounts the ECs 86 on the PCB 32. Each of the sixteen shaft members 72 or the sixteen adaptors 100 is positioned at the EC-suck-and-mount position by the rotation of the intermittent-rotation body 68, and is moved by the X-Y robot 62 to a position right above an EC-mount place on the PCB 32.

During the above-described movement of each shaft member 72, the each shaft member 72 is rotated about its own axis line, so that the EC suction nozzle 84 carried by the each shaft member 72 is also rotated about its own axis line to correct a possible angular error of the EC 86 held by the nozzle 84 from a reference angular position. In addition, the current angular position of the EC 86 held by each nozzle 84 may be changed to a prescribed angular position. Before the ECs 86 are mounted on the PCB 32, the reference-mark-image taking device 162 takes respective images of the reference marks affixed to the PCB 32, and the control device 330 calculates, based on the taken images, respective positional errors of each of prescribed EC-mount places on the PCB 32 in the X-axis and Y-axis directions. The respective distances of movement of each of the shaft members 72 in the X-axis and Y-axis directions are modified to correct the respective positional errors of a corresponding one of the prescribed EC-mount places on the PCB 32 in the X-axis and Y-axis directions, and the respective positional errors of the center of the EC 86 held by the each shaft member 72 in the X-axis and Y-axis directions. The respective positional errors of the center of the EC 86 held by the each shaft member 72 in the X-axis and Y-axis directions are respective sums of respective positional errors of the center of the EC 86 which are produced when the nozzle 84 carried by the each shaft member 72 sucks the EC 86, respective positional changes of the center of the EC 86 which are produced when the angular error of the EC 86 is corrected by the rotation thereof, and respective positional changes of the center of the EC 86 which are produced when the current angular position of the EC 86 is changed to the prescribed angular position by the rotation thereof. After the above-described movement of each shaft member 72, the each shaft member 72 is lowered by the elevating and lowering device 170, so that the EC 86 is placed on the PCB 32. Subsequently, the suction nozzle 84 is communicated with the atmosphere, and the vacuum (i.e., negative pressure) is cut from the nozzle 84. After the EC 86 is mounted on the PCB 32, the shaft member 72 is elevated. The intermittent rotation of the rotation body 68 and the movement of the mounting head 50 are repeated so that all the ECs 86 held by the head 50 are mounted on the PCB 32. Then, the head 50 is moved to the EC supplying device 16 to take additional ECs 86 from the device 16.

When the EC transferring and mounting apparatus 20, 22 mounts ECs 86 on a PCB 32, such an event may be encountered that none of the current EC suction nozzles 84 held by the sixteen shaft members 72 (more strictly, by the sixteen adaptors 100 carried by the shaft members 72) can suck one or more particular ECs 86 depending upon the particular sort of the EC or ECs 86. In that event, one of the current nozzles 84 is exchanged with an appropriate nozzle 84. To this end, after the EC mounting head 50, 52 mounts, on the PCB 32, all the ECS 86 held by the current nozzles 84, the head 50 drops in the suction-nozzle exchanging device 190, 192 on the way to the EC supplying device 16, 18. There will be described a nozzle exchanging operation carried out by the EC transferring and mounting apparatus 20, as a representative of those carried out by the two apparatuses 20, 22, since an identical operation is carried out by the apparatus 22.

For example, it is assumed that the current EC suction nozzles 84 carried by the sixteen shaft members 72 are all for holding small-size ECs 86 and that the mounting of the small-size ECs 86 has been finished and subsequently the mounting of medium-size ECs 86 and large-size ECs 86 will be carried out. In this case, all the sixteen nozzles 84 are exchanged with appropriate nozzles 84. However, in some cases, only one or more, but not all, of the sixteen nozzles 84 is or are exchanged with one or more appropriate nozzles 84, depending upon the sort or sorts of ECs 86 to be mounted.

In the present embodiment, the sixteen shaft members 72 (more strictly, the sixteen adaptors 100 carried by the shaft members 72) take respective nozzles 84 from the single nozzle holding member 194 and return those nozzles 84 to the same holding member 194. Accordingly, when the nozzle holding member 194 is attached to the holding-member supporting member 204 before the mounting of ECs 86 is started, the sixteen shaft members 72 have not held respective nozzles 84 yet. Before the mounting of ECs 86, first, the shaft members 72 hold respective nozzles 84. In the state in which the shaft members 72 hold respective nozzles 84, the single nozzle holding member 194 has at least sixteen empty nozzle holding holes 250 from which the sixteen nozzles 84 have been taken by the sixteen shaft members 72 or the sixteen adaptors 100. When the shaft members 72 exchange the current nozzles 84 with other appropriate nozzles 84 held by the holding member 194, first, the shaft members 72 returns the current nozzles 84 to the corresponding empty holes 250 of the holding member 194. The control device 330 or the computer 340 stores a batch of data indicative of the respective sorts of the current nozzles 84 carried by the shaft members 72, and a batch of data indicative of the respective positions of the empty holes 250 from which those nozzles 84 are taken by the shaft members 72. The control device 330 calculates, based on those batches of data, the respective distances of movement of the EC mounting head 50 in the X-axis and Y-axis directions. In addition, the control device 330 operates the head 50 to revolve each of the shaft members 72 to the EC-suck-and-mount position, and moves the head 50 so that the each shaft member 72 is positioned at a position right above a corresponding one of the empty holes 250. However, the control device 330 may be programmed such that each nozzle 84 is returned to an empty hole 250 which is not the very hole 250 by which the each nozzle 84 is held at the beginning, but is of the same sort as that of the very hole 250.

When the current nozzles 84 are exchanged, each of the shaft members 72 (more strictly, the adaptors 100 carried by the shaft members 72) holding the current nozzles 84 is moved to the EC-suck-and-mount position by the intermittent rotation of the rotation body 68, and is moved by the X-Y robot 62 to a position right above an appropriate one of the empty holes 250. During this movement of each shaft member 72, the nozzle holding member 194 is held at its lower stroke-end position. After the movement of the each shaft member 72, the holding-member supporting member 204 is elevated so that the holding member 194 is elevated to its upper stroke-end position.

Before the nozzle holding member 194 is elevated, the nozzle sensor 324 detects and judges whether the above-described appropriate one hole 250 is actually empty. If a positive judgment is made, the current nozzle 84 held by each shaft member 72 is returned to the one hole 250. However, if a negative judgment is made, the current nozzle exchanging operation is terminated, and the control device 330 operates the alarming device 358 to generate an alarm sound to inform the operator of the occurrence of an abnormality. Thus, the present apparatus 20 can prevent the nozzle holding member 194 from being elevated when that one hole 250 is not actually empty, and thereby prevents the current nozzle 84 held by the each shaft member 72 and the nozzle 84 held by that one hole 250, from colliding with, and being damaged by, each other.

If the above-indicated appropriate one hole 250 is empty, the nozzle holding member 194 is allowed to be elevated. Even in the case where at least one of two or more nozzle holding holes 250 adjacent to the one empty hole 250 holds a nozzle 84 and at least one of two shaft members 72 on both sides of, and adjacent to, the shaft member 72 being positioned at the EC-suck-and-mount position holds a nozzle 84, the tapered portion 136 of the former nozzle 84 cannot be aligned with the suction pipe 134 of the latter nozzle 84 and accordingly cannot be contacted with the latter nozzle 84. In FIG. 12, a two-dot chain line indicates, on a plane perpendicularly intersecting the axis line, 0, of rotation of the intermittent-rotation body 68, a circle whose center is located on the axis line 0 and which intersects the respective axis lines of the shaft members 72. The respective positions of the nozzle holding holes 250 on the nozzle holding member 194 are predetermined, based on the radius of the above circle and the respective positions of the sixteen shaft members 72, such that in the state in which one shaft member 72 being positioned at the EC-suck-and-mount position is positioned at a position right above one empty hole 250, the respective suction pipes 134 of the two nozzles 84 held by the two adaptors 100 carried by the two shaft members 72 on both sides of, adjacent to, the one shaft member 72 do not interfere with the respective tapered portions 136 of all the nozzles 84 held by the holding member 194. The height position of the cam surface 80 increases in a direction away from the EC-suck-and-mount position. Therefore, the remaining shaft members 72 other than the above-indicated one shaft member 72 and its adjacent two shaft members 72 are positioned at respective height positions higher than those at which the latter three shaft members 72 are positioned. Thus, the nozzles 84 held by the remaining shaft members 72 cannot collide with the nozzles 84 held by the nozzle holding member 194, irrespective of where the nozzle holding holes 250 are formed in the holding member 194.

After the nozzle holding member 194 is elevated, the above-indicated one shaft member 72 is lowered by the elevating and lowering device 170, so that the suction pipe 134 of the EC suction nozzle 84 held by the one shaft member 72 is fitted in the small-diameter portion 254 of the above-indicated one empty hole 250. In this state, the nozzle-removal inhibiting plate 280 is held in its operative position, and the light emitting plate 146 of the nozzle 84 is positioned at a height position slightly higher than that of the inhibiting plate 280.

After the suction pipe 134 is fitted in the small-diameter portion 254, the nozzle-removal inhibiting plate 280 is moved to its inoperative position by the air cylinder 312. Subsequently, the shaft member 72 is further moved downward by the elevating and lowering device 170 so that the light emitting plate 146 is fitted in the large-diameter portion 256. The distance of the downward movement of the shaft member 72 is determined by adding an additional value to the distance between the plate 146 and the portion 256. The additional value is predetermined by taking into account the manufacturing errors of, e.g., the suction-nozzle exchanging device 190, and other factors. Any excessive downward movement of the shaft member 72 is accommodated by compression of the compression coil spring 108. After the downward movement of the shaft member 72, the nozzle-removal inhibiting plate 280 is returned to its operative position by the air cylinder 312, and the drive member 178 is moved to a position, e.g., its upper stroke-end position, where the nozzle 84 is allowed to be removed from the adaptor 100, so that the shaft member 72 is moved upward to its upper stroke-end position. During this upward movement of the shaft member 72, a relevant pair of nozzle-removal inhibiting portions 288 of the plate 280 engage the light emitting plate 146, thereby inhibiting the nozzle 84 from being removed from the nozzle holding member 194. More specifically described, since the pair of nozzle-removal inhibiting portions 288 apply, to the nozzle 84, a force greater than the drawing force of the spring member 140 to draw the nozzle 84 into the adaptor 100, i.e., the holding force of the adaptor 100 to hold the nozzle 84, in a direction in which the nozzle 84 is moved away from the adaptor 100, the nozzle 84 is removed from the adaptor 100 and is held by the nozzle holding member 194.

After the shaft member 72 returns the EC suction nozzle 84 to the nozzle holding member 194 in this way, the holding member 194 is moved downward to its lower stroke-end position. After this downward movement of the holding member 194, the shaft member 72 which has returns the nozzle 84 to the holding member 194, is moved by the X-Y robot 62 to a position right above one of the nozzle holding holes 250 5 that should be holding the nozzle 84 that is to be next held by the shaft member 72. In this situation, the holding member 194 is positioned at its lower stroke-end position. Therefore, even in the case where at least one of the respective adaptors 100 of the two shaft members 72 on both sides of, and adjacent to, the shaft member 72 being positioned at the EC-suck-and-mount position holds a nozzle 84, that nozzle 84 cannot collide with any of the nozzles 84 held by the holding member 194.

After the above-described movement of the shaft member 72, and before the nozzle holding member 194 is elevated, the nozzle sensor 324 detects or judges whether the above-indicated one hole 250 is actually holding the nozzle 84 to be next used by the shaft member 72. If a negative judgment is made, the current nozzle exchanging operation is terminated, and the control device 330 operates the alarming device 358 to generate an alarm sound to inform the operator of the occurrence of an abnormality. On the other hand, if a positive judgment is made, the nozzle holding member 194 is moved upward to its upper stroke-end position. The respective positions of the holes 250 on the nozzle holding member 194 are predetermined such that even in the case where at least one of the respective adaptors 100 of the two shaft members 72 on both sides of, and adjacent to, the shaft member 72 whose adaptor 100 is currently empty holds a nozzle 84, that nozzle 84 cannot collide with any of the nozzles 84 held by the holding member 194.

After the nozzle holding member 194 is moved upward, the shaft member 72 is moved downward so that the tapered portion 136 of the EC suction nozzle 84 held by the holding member 194 is fitted in the tapered hole 138 of the adaptor 100 carried by the shaft member 72. The distance of the downward movement of the shaft member 72 is determined by adding an additional value to the distance needed for the tapered portion 136 to be fitted in the tapered hole 138. The additional value is predetermined by taking into account the manufacturing errors of, e.g., the suction-nozzle exchanging device 190, and other factors. Thus, the tapered portion 136 is reliably fitted in the tapered hole 138 and is reliably held by the spring member 140. Any excessive downward movement of the shaft member 72 is accommodated by compression of the compression coil spring 108.

After the tapered portion 136 is fitted in the tapered hole 138, the nozzle-removal inhibiting plate 280 is moved to its inoperative position. Subsequently, the shaft member 72 is moved upward to its upper stroke-end position, and the EC suction nozzle 84 is removed from the nozzle holding member 194. Then, the plate 280 is moved to its operative position, and the holding member is moved downward to its lower stroke-end position in the state in which the nozzles 84 held by the holding member 194 are inhibited from jumping off the same 194. Then, another shaft member 72 which holds the nozzle 84 to be next exchanged is moved to the EC-suck-and-mount position by the rotation of the rotation body 68, and is moved by the X-Y robot 62 to a position right above an appropriate one of the empty holes 250 of the holding member 194. While the holding member 194 is moved up and down and the shaft member 72 is moved down and up and is moved horizontally, the current nozzle 84 held by the shaft member 72 is returned to the holding member 194 and takes the nozzle 84 held by the above-indicated one empty hole 250. After all the current nozzles 84 held by the shaft members 72 or the adaptors 100 are exchanged with appropriate nozzles 84 held by the holding member 194, the EC mounting head 50 is further moved to the EC supplying device 16, so as to take ECs 86 from the device 16. Subsequently, the head 50 mounts the ECs 86 on the PCB 32. Thus, when the nozzle exchanging operation is carried out, one or more of the shaft members 72 is moved down and up, and the nozzle holding member 194 is moved up and down. This contributes to reducing the stroke of upward and downward movement of the shaft members 72 needed for the nozzle exchanging operation.

In the state, before the EC mounting operation is started, in which the sixteen shaft members 72 do not have respective nozzles 84, the sixteen shaft members 72 only repeat respective nozzle holding operations and do not carry out any nozzle returning operations.

When the initial sort of PCBs 32 are changed to another sort of PCBs 32, the operator must change the initial set-up to another set-up corresponding to the new sort of PCBs 32. For example, the sorts of EC suction nozzles 84 held by the single nozzle holding member 194 may not suffice for holding all the sorts of ECs 86 to be mounted on each PCB 32 of the new sort. In this case, the current nozzle holding member 194 supported by the holding-member supporting member 204 is exchanged with an appropriate nozzle holding member 194 which holds a sufficient number of sorts of nozzles 84 to hold all the sorts of ECs 86 to be mounted on each PCB 32 of the new sort. When the current set-up is changed to another set-up, for example, the respective PCB-convey widths of the main conveyors 24, 26 and the carry-in and carry-out conveyors 28, 30 of the PCB conveyor 14 are changed or adjusted to respective appropriate widths, and one or more of the EC feeders 42 of the EC supplying devices 16, 18 is or are exchanged with one or more appropriate EC feeders 42. Each nozzle holding member 194 is attached to, and detached from, the holding-member supporting member 204, without being obstructed by the EC feeders 42, in the state in which all the EC feeders 42 have been removed from the feeder-support table 40. Before the current nozzle holding member 194 supported by the holding-member supporting member 204 is exchanged with an appropriate nozzle holding member 194, the sixteen shaft members 72 only repeats respective nozzle returning operations and do not carry out any nozzle holding operations. Thus, all the respective adaptors 100 of the sixteen shaft members 72 return the respective nozzles 84 to the current nozzle holding member 194. Thus, the sixteen nozzles 84 are simultaneously exchanged with sixteen appropriate nozzles 84. Thus, each nozzle holding member 194 continues to hold the same number and sort or sorts of nozzles 84 at the same positions. Even when the current set-up is changed to another set-up, the operator does not exchange the current nozzle holding member 194, if there is no need to do so.

The current nozzle holding member 194 is manually exchanged with another by the operator. First, the operator detaches the current holding member 194 which is attached to the holding-member supporting member 204. To this end, the operator pivots the lever 234 in a direction in which the lever 234 is moved away from the main member 232. As a result, together with the lever 234, the axis member 235 and the arms 236, 238 are also moved away from the main member 232, so that the lever 234 takes an attitude largely inclined relative to the main member 232. Then, the engaging member 240 is disengaged from the engageable portion 272 of the engaging member 268 fixed to the holding member 194. The operator pivots the arms 236, 238 and thereby moves the engaging member 240 to a position opposite to the axis line of pivotal motion of the lever 234 with respect to the axis member 235, till the engaging member 240 is positioned below the supporting member 204. The fastening device 230 is unfastened, and the engaging member 240 is moved to a position where the engaging member 240 cannot engage the engaging member 268. The operator moves the holding member 194 in a direction in which the notches 262 are moved away from the headed pins 218, and thereby detaches the holding member 194 from the supporting member 204. When the holding member 194 is detached from the supporting member 204, the nozzle-removal inhibiting plate 280 is held at its operative position where the inhibiting plate 280 inhibits or prevents the EC suction nozzles 84 from being removed from the holding member 194. Accordingly, even if the holding member 194 may be is tilted, the nozzles 84 are prevented from falling off the holding member 194. Thus, the operator can easily detach the holding member 194 from the supporting member 204 and can easily convey the holding member 194 detached.

After the operator detaches the current nozzle holding member 194 from the holding-member supporting member 204, he or she attaches, to the holding-member supporting member 204, a new nozzle holding member 194 which holds all the necessary EC suction nozzles 84. At a place distant from the EC mounting system 10, the operator has already caused the new holding member 194 to hold all the necessary nozzles 84, while the EC mounting system 10 mounts the ECs 86 on the PCB 32 using the current holding member 194.

When the operator attaches the new nozzle holding member 194 to the holding-member supporting member 204, he or she finds that the engaging member 240 of the fastening device 230 is positioned below the holding-member supporting surface 206 of the supporting member 204 and cannot engage the engageable portion 272 of the engaging member 268. Hence, first, the operator places the new holding member 194 on the supporting member 204, and moves the holding member 194 on the supporting surface 206 in a direction in which the notches 262 approach the headed pins 218, till the notches 262 engage the axial portions 222 of the pins 218 and the engaging surfaces 264 engage the head portions 224 of the pins 218. Since the width of each of the notches 262 increases in a direction toward its opening in the side surface of the holding member 194, the wide opening of each notch 262 guides or facilitates the engagement of each notch 262 with the corresponding pin 218. Thus, the operator can easily engage the notches 262 with the pins 218.

In the above state, the operator pivots the arms 236, 238 of the fastening device 230 about the axis member 235 away from the main member 232, and thereby pivots the lever 234 upward to a position where the engaging member 240 can engage the engageable portion 272 of the engaging member 268. In this state, the operator pivots the lever 234 toward the main member 232, and thereby engages the engaging member 240 with the engageable portion 272. The operator further pivots the lever 234, and thereby moves the arms 236 relative to the arms 238 in a direction away from the engaging member 240, so that the compression coil springs 242 are compressed.

The pivotal motion of the lever 234 is stopped by the stopper 244 at a position where the axis member 235 is nearer to the main member 232 than a straight line passing through the axis line of pivotal motion of the lever 234 and the engaging member 240. Therefore, the compression coil springs 242 bias the arms 236, 238, in the state in which the coil springs 242 are compressed to a considerably high degree but not to the highest degree. That is, the main member 232, the lever 234, the arms 236, 238, and the compression coil springs 242 cooperate with one another to provide a center-over (or dead-point-over) mechanism. Since the coil springs 242 are inclined relative to the holding-member supporting surface 206, the springs 242 apply, as described previously, a biasing force having a first direction component to bias the holding member 194 toward the headed pins 218 and a second direction component to bias the supported surface 252 of the same 194 toward the holding-member supporting surface 206 of the supporting member 204. Thus, the holding member 194 is stably attached to the supporting member 204. The holding-member holding device 196 holds the nozzle holding member 194, without needing to use any tools, such that the holding member 194 is detachable from the holding device 196. A plurality of EC suction nozzles 84 are simultaneously exchanged with a plurality of other EC suction nozzles 84, by exchanging a single nozzle holding member 194 with another nozzle holding member 194. In the state in which each nozzle holding member 194 is attached to the holding-member supporting member 204, the head portions 224 of the headed pins 218 are lower than the upper surface of the each holding member 194. Therefore, the pins 218 do not interfere with the nozzle-removal inhibiting plate 280.

When each nozzle holding member 194 is attached to the holding-member supporting member 204, the piston rod 314 of the air cylinder 312 is held at its retracted position and the nozzle-removal inhibiting plate 280 is held at its operative position where the engageable portion 308 of the projection 306 of the plate 280 is engaged with the recess 318 of the engaging member 316. The recess 318 is formed to extend in a direction perpendicular to the lengthwise direction of the supporting member 204 and parallel to the direction in which the notches 262 are moved toward the headed pins 218 to attach the holding member 194 to the supporting member 204. When the holding member 194 is moved on the supporting member 204 to move the notches 262 toward the pins 218, the engageable portion 308 enters the recess 318. Even if the engageable portion 308 may not be aligned with the recess 318, the portion 308 can be guided by one pair of guide surfaces 320 so as to be fitted in the recess 318, while slightly expanding the compression coil spring 300. Therefore, the operative position of the plate 280 with the holding member 194 being attached to the supporting member 204 may differ from that of the same 280 with the holding member 194 being detached from the supporting member 204. However, since this difference is very small, all the pairs of nozzle-removal inhibiting portions 288 can cover the corresponding nozzle holding holes 250.

In the suction-nozzle exchanging device 190, the headed pins 218 are attached to one of the widthwise opposite end portions of the holding-member supporting member 204 that is nearer to the PCB conveyor 14, and the fastening device 230 is attached to the other end portion of the supporting member 204 nearer to the EC supplying device 16. Since the EC feeders 42 are detached from the feeder-support table 40 when each nozzle holding member 194 is attached to, and detached from, the holding-member supporting member 204, the operator who stands on the side of the EC supplying device 16 can easily operate the fastening device 230 without being obstructed by anything.

As is apparent from the foregoing description, in the present embodiment, the X-Y robot 62, 64, the rotating device which intermittently rotates the intermittent-rotation body 68, and the elevating and lowering device 170 which elevates and lowers each of the shaft members 72 cooperates with one another to provide a chuck moving device; the air cylinder 200 provides a holding-member moving device; and the chuck moving device and the holding-member moving device cooperate with each other to provide an nozzle-exchange moving device.

In the illustrated embodiment, after the shaft member 72 being positioned at the EC-suck-and-mount position returns the current EC suction nozzle 84 to the nozzle holding member 194, and before the "empty" shaft member 72 is moved to take the next "target" nozzle 84 from the same 194, the holding member 194 is moved downward to its lower stroke-end position. However, this downward movement of the holding member 194 is not essentially needed. To this end, for example, a route along which the empty shaft member 72 is moved may be predetermined such that even in the case where at least one of two shaft members 72 on both sides, and adjacent to, the empty shaft member 72 holds an EC suction nozzle 84, the empty shaft member 72 can be moved to a position right above the target nozzle 84 while the suction pipe 134 of that nozzle 84 does not interfere with the respective tapered portions 136 of the nozzles 84 held on the holding member 194. Since the empty shaft member 72 is held at a position where the current nozzle 84 is removed from the adaptor 100 thereof, for example, its upper stroke-end position, and is holding no nozzle 84, the empty shaft member 72 does not collide with any nozzles 84 held by the holding member 194.

Figure 18:
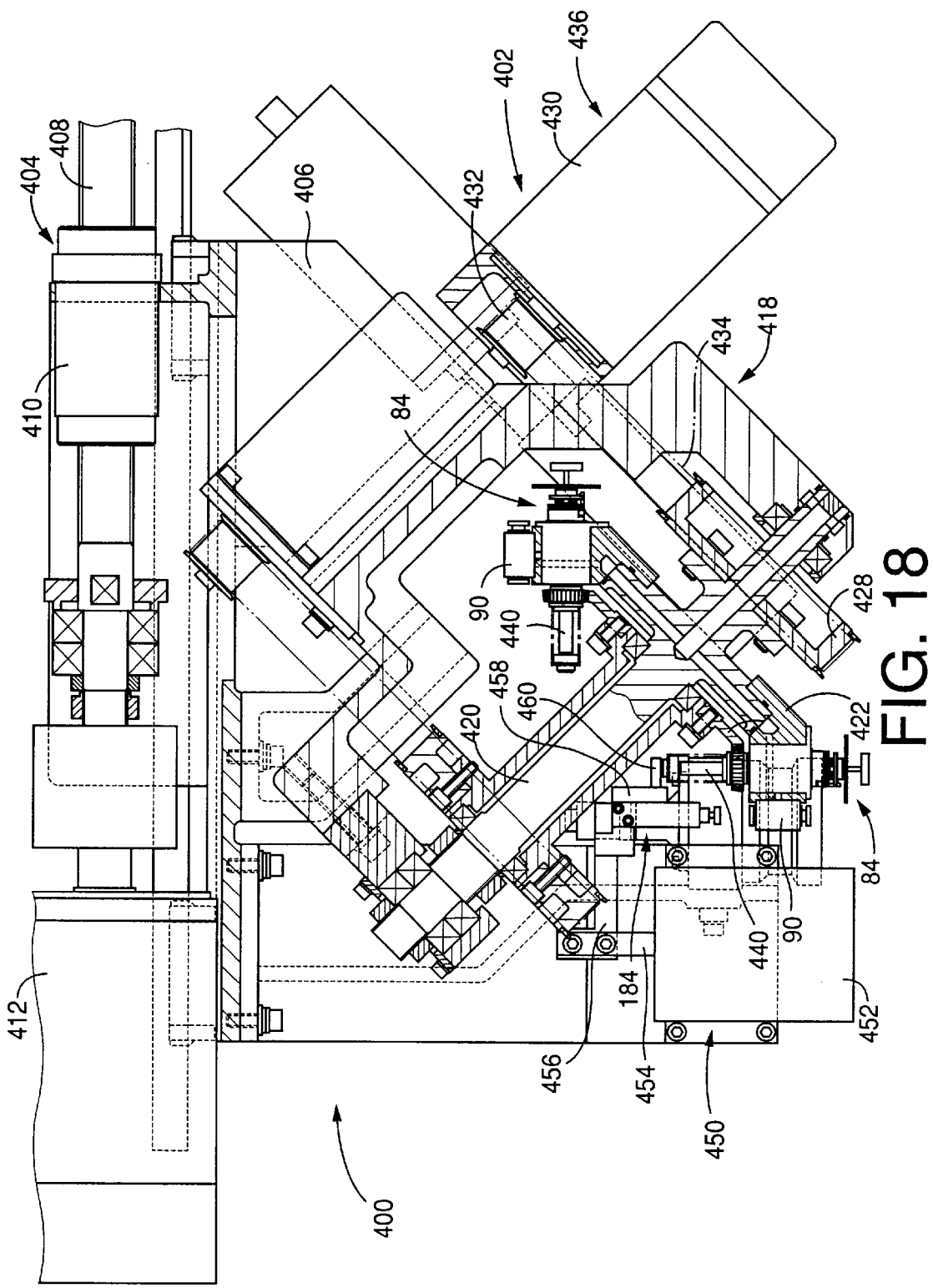
FIG. 18 is a partly cross-sectioned, front elevation view of another EC transferring and mounting apparatus which embodies the present invention and which carries out another nozzle exchanging method which embodies the present invention.
Figure 19:
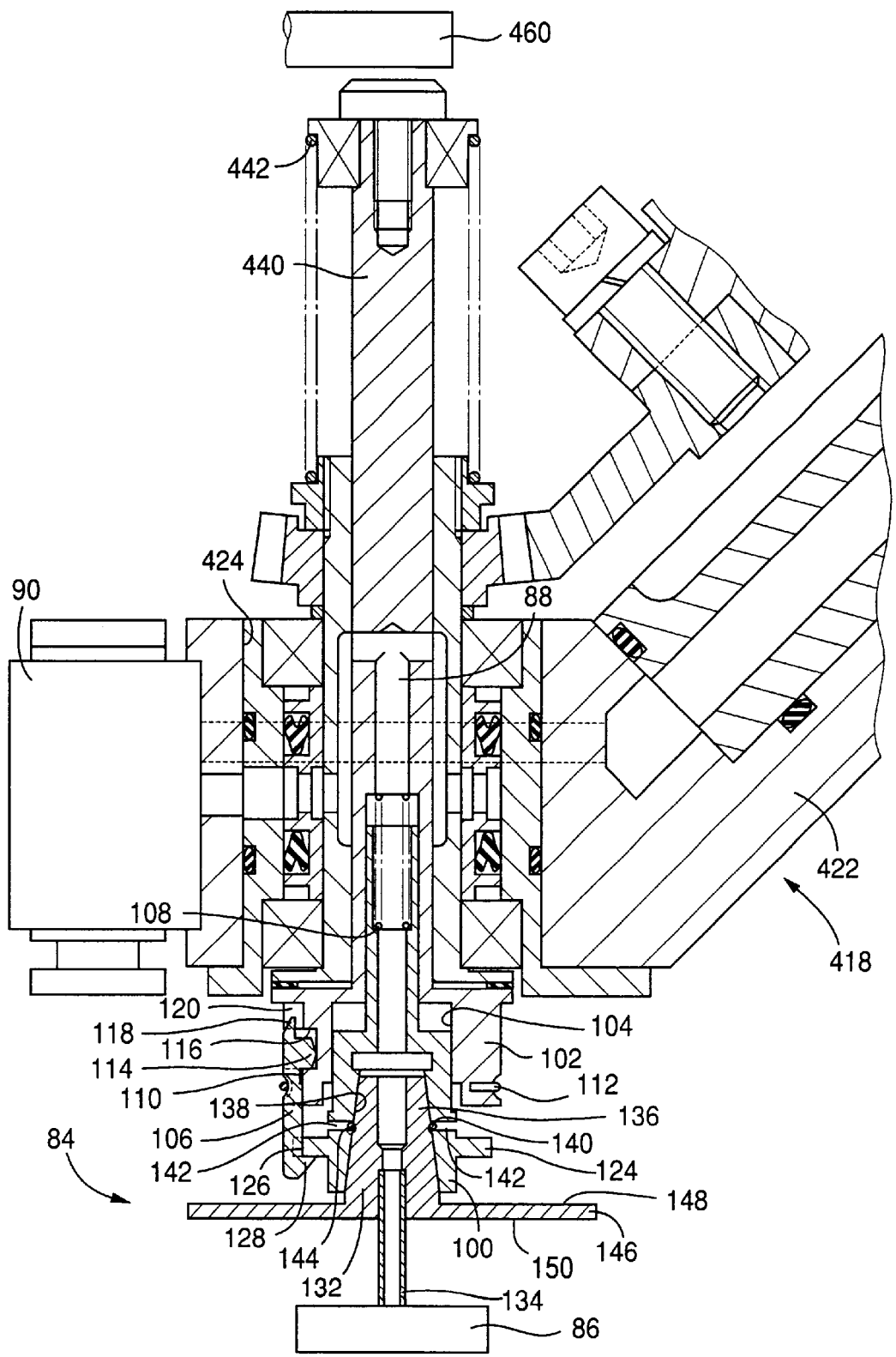
FIG. 19 is a cross-sectioned, front elevation view of a shaft member and an EC suction nozzle of the EC transferring and mounting apparatus of FIG. 18.

FIGS. 18 and 19 show another EC transferring and mounting apparatus 400 which may be employed in place of each of the two EC transferring and mounting apparatuses 20, 22. In this apparatus 400, an axis line of rotation of an intermittent-rotation body 418 is inclined with respect to a vertical line perpendicular to the horizontal plane which is defined by the EC supplying devices 16, 18 and the PCB convey device 14 and along which the PCB 32 is conveyed by the PCB convey device 14. In this apparatus 400, when an "empty" shaft member 72 is moved to a position right above a "target" nozzle 84 held on a nozzle holding member 194, it is not needed to move the holding member 194 downward, irrespective of which route the empty shaft member 72 is moved along. In addition, the present apparatus 400 enjoys a high degree of freedom about how a plurality of nozzle holding holes 250 are arranged on the plane of the holding member 194. The EC transferring and mounting apparatus 400 has, except for the suction-nozzle exchanging device 190, 192, the same construction as that of the EC transferring and mounting apparatus disclosed in U.S. patent application Ser. No. 08/977,662 assigned to the assignee of the present application. Therefore, only a relevant portion of the disclosed apparatus will be described below. In addition, the same reference numerals as used in the first embodiment shown in FIGS. 1 to 17 are used to designate the corresponding elements and parts of the second embodiment shown in FIGS. 18 and 19, and no repeated description thereof will be provided.

The EC transferring and mounting apparatus 400 includes an EC mounting head 402 which is moved by an X-Y robot 404 along a horizontal plane, like each of the EC mounting heads 62, 64 shown in FIG. 1. The X-Y robot 404 includes an X-axis slide 406; a Y-axis slide (not shown); a feed screw 408 which is supported by the Y-axis slide such that the feed screw 408 is rotatable about an axis line parallel to an X-axis direction and is not movable in an axial direction thereof; a nut 410 which is fixed to the X-axis slide 406 and is screwed on the feed screw 408; and an X-axis-slide moving servomotor 412. The X-Y robot 404 moves the EC mounting head 402 to an arbitrary position on the horizontal plane.

The X-axis slide 406 supports an intermittent-rotation body 418 such that the rotation body 418 is rotatable about an axis line inclined with respect to a vertical line perpendicular to the horizontal plane. The rotation body 418 includes an axis member 420 which is supported by the X-axis slide 406 such that the axis member 420 is rotatable about the inclined axis line; and a shaft-member supporting member 422 which is fixed to the axis member 420. The shaft-member supporting member 422 has sixteen support holes 424, such that respective center lines of the sixteen support holes 424 are defined by sixteen generators of a conical surface whose center line coincides with the inclined axis line of the axis member 420. The rotation body 418 is attached to the X-axis slide 406 such that the inclined axis line of the axis member 420 is inclined relative to a line perpendicular to a horizontal head-convey plane, by an angle which assures that one of the sixteen generators of the conical surface perpendicularly intersects the horizontal head-convey plane.

The intermittent-rotation body 418 is accurately rotated by an arbitrary angle in each of opposite directions about the inclined axis line of the axis member 420, by a rotating device 436 which includes a driven pulley 428 fixed to the axis member 420; a rotating servomotor 430 as a drive source; a drive pulley 432; and a timing or cog belt 434. The sixteen support holes 424 supports respective shaft members 440 such that each of the shaft members 440 is rotatable about its own axis line and is movable in an axial direction thereof relative to the shaft-member supporting member 422. The sixteen shaft members 440 are biased upward by respective compression coil springs 442 each as an elastic member as a sort of biasing device. Each of the shaft members 440 includes a nozzle holding portion 102 identical with the nozzle holding portion 102 of each of the shaft members 72 shown in FIG. 2. The nozzle holding portion 102 of each of the shaft members 440 carries an adaptor 100 which holds an EC suction nozzle 84 such that the suction nozzle 84 is removable therefrom.

When the rotation body 418 is intermittently rotated, each of the sixteen shaft members 440 is sequentially stopped at each of sixteen stop positions. The sixteen stop positions includes an EC-suck-and-mount position where the axis line of each shaft member 440 perpendicularly intersects the horizontal head-convey plane, and an EC-image-take position which is angularly spaced by 90 degrees from the EC-suck-and-mount position and at which an image of an EC 86 held by each shaft member 440 or each EC suction nozzle 84 is taken. Since in the present embodiment the head-convey plane is horizontal, the shaft member 440 being positioned at the EC-suck-and-mount position extends vertically. Since the axis line of rotation of the rotation body 418 is inclined, the shaft member 440 being positioned at the EC-suck-and-mount position takes the lowest position of all the shaft members 440. In the present apparatus 400, each shaft member 440 is not elevated or lowered by the combination of a cam and a cam follower. However, since the axis line of rotation of the rotation body 418 is inclined relative to the head-convey plane, the sixteen shaft members 440 take different height positions.

As shown in FIG. 18, an elevating and lowering device 450 which elevates and lowers each shaft member 440 is provided at a position on the X-axis slide 406 that corresponds to the EC-suck-and-mount position. The elevating and lowering device 450 includes a linear motor 452 as a drive source; an active member 454; a movable member 456; a drive member 458; and a drive portion 460. The linear motor 452 is provided by a servomotor. When the movable member 456 is lowered by the linear motor 452 and accordingly the drive member 458 and the drive portion 460 are lowered, the drive portion 460 engages the shaft member 440 being positioned at the EC-suck-and-mount position, so that the shaft member 440 is lowered against the biasing force of the compression coil spring 442. On the other hand, when the movable member 456 is elevated and accordingly the drive member 458 and the drive portion 460 are elevated, the shaft member 440 is elevated by the biasing force of the coil spring 442.

The present EC transferring and mounting apparatus 400 is employed by an EC mounting system which includes a control device (not shown) which controls the X-axis-slide moving servomotor 412, the rotating servomotor 430, the linear motor 452, etc., of the apparatus 400. A nozzle sensor (not shown) identical with the nozzle sensor 324 shown in FIG. 16 is provided at a position on the X-axis slide 406 that corresponds to the EC-suck-and-mount position. The nozzle sensor of the present apparatus 400 is located inside the locus of revolution of the respective axis lines of the shaft members 440 supported by the rotation body 418.

When the EC suction nozzle 84 carried by one shaft member 440 is exchanged with one of a plurality of EC suction nozzles 84 held by a nozzle holding member 194, first, the one shaft member 440 is moved to the EC-suck-and-mount position by the rotation of the intermittent-rotation body 86, and is moved by the X-Y robot 404 to a position right above one nozzle holding hole 250 of the holding member 194 that should be empty. If the one hole 250 is actually empty, the holding member 194 is moved upward to its upper stroke-end position. Since the axis line of rotation of the rotation body 418 is inclined, the two nozzles 84 held by the respective adaptors 100 of the two shaft members 440 on both sides of, and adjacent to, the one shaft member 440 being positioned at the EC-suck-and-mount position are positioned above the nozzles 84 held by the holding member 194, even if the holding member 194 is positioned at its upper stroke-end position. Thus, the former nozzles 84 are prevented from colliding with the latter nozzles 84, irrespective of how the plurality of nozzle holding holes 250 are arranged on the holder holding member 194. That is, the present apparatus 400 enjoys a high degree of freedom of arrangement of the holes 250 on the holding member 194.

After the nozzle holding member 194 is moved to its upper stroke-end position, the one shaft member 440 is lowered so that the suction pipe 134 is fitted in the small-diameter portion 254, subsequently the nozzle-removal inhibiting plate 280 is moved to its inoperative position, then the one shaft member 440 is lowered so that the light emitting plate 146 is fitted in the large-diameter portion 256, next the plate 280 is moved to its operative position, and the one shaft member 440 is elevated. Thus, the nozzle 84 held by the one shaft member 440 is returned to the holding member 194. In the state in which the holding member 194 is held at its upper stroke-end position, the rotation body 418 is moved by the X-Y robot 404, so that the "empty" adaptor 100 of the one shaft member 440 is moved to a position right above an appropriate nozzle 84 held by the holding member 194. During this movement of the body 418, the one shaft member 440 is held at an elevated position, the adaptor 100 of the one shaft member 440 is empty, and the two nozzles 84 held by the respective adaptors 100 of the two shaft members 440 on both sides of, and adjacent to, the one shaft member 440 being positioned at the EC-suck-and-mount position are positioned, because of the inclination of the body 418, above the nozzles 84 held by the holding member 194 being positioned at its upper stroke-end position. Thus, the nozzles 84 held by the respective adaptors 100 of the shaft members 440 are prevented from colliding with the nozzles 84 held by the holding member 194, even if the holding member 194 is positioned at its upper stroke-end position. Thus, it is not necessary to lower the holding member 194 to its lower stroke-end position, when the empty adaptor 100 of the one shaft member 440 is moved to a position right above a nozzle 84 to be next held thereby. In addition, the present apparatus 400 enjoys a high degree of freedom of determining a route along which the one shaft member 440 is moved to the next nozzle 84.

After the above-described movement of the rotation body 418, the one shaft member 440 is lowered by the elevating and lowering device 450, the nozzle-removal inhibiting member 280 is moved to its inoperative position, and the empty adaptor 100 of the one shaft member 440 holds the next nozzle 84 and takes the nozzle 84 from the nozzle holding member 194. Subsequently, the plate 280 is moved to its operative position, and the holding member 194 is lowered to its lower stroke-end position. Then, the rotation body 418 is further rotated so that another shaft member holding the nozzle 84 to be next exchanged is moved to the EC-suck-and-mount position, and is further moved to a position right above one empty hole 250 of the holding member 194. Since the holding member 194 is positioned at its lower stroke-end position, the rotation body 418 can be rotated and moved in the state in which the nozzles 84 held by the shaft members 440 are prevented from colliding with the nozzles 84 held by the holding member 194.

In each of the illustrated embodiments, the respective adaptors 100 of the sixteen shaft members 72, 440 take respective EC nozzles 84 from the single nozzle holding member 194 and return those nozzles 84 to the same 194. In addition, when the current nozzle holding member 194 held by the holding-member holding device 196 is exchanged with a different nozzle holding member 194 that is not held by the holding device 196, first, all the current nozzles 84 held by the EC mounting head 50, 52, 402 are returned to the holding member 194, and all the nozzles 84 held by the current holding member 194 are simultaneously exchanged with a plurality of nozzles 84 held by the different holding member 194. However, it is possible to return, to the current holding member 194, only one or more nozzles 84 which actually need to be exchanged. In the latter case, the nozzle or nozzles 84 may not be returned to a nozzle holding member 194 from which the nozzle or nozzles 84 was or were taken. However, the computer 340 of the control device 330 stores data indicative of which sort of nozzle or nozzles 84 is or are held by which one or ones of the nozzle holding holes 250 of which one of the nozzle holding members 194, and data indicative of which one or ones of the nozzle holding holes 250 of which one of the nozzle holding members 194 is or are empty. Therefore, the control device 330 can inform the operator of whether the current nozzle holding member 194 should be exchanged, and which one of the nozzle holding members 194 should be used in place of the current one 194. According to the information, e.g., displayed on a display device (not shown) by the control device 330, the operator can easily exchange the current one 194 with the appropriate one 194 indicated by the information.

In addition, it is possible to supply, from a plurality of nozzle holding members 194, a plurality of (e.g., two) EC suction nozzles 84 needed for mounting ECs 86 on each sort of PCB 32. In this case, first, as many as possible nozzles 84 out of all the current nozzles 84 held by the EC mounting head 50, 52, 402 are exchanged with appropriate ones of the nozzles 84 held by the current nozzle holding member 194 held by the holding-member holding device 196, subsequently the current holding member 194 is exchanged with a new nozzle holding member 194, and then the remaining current nozzles 84 held by the head 50, 52, 402 are exchanged with appropriate ones of the nozzles 84 held by the new nozzle holding member 194 held by the holding device 196. In this case, too, the operator can easily exchange the current holding member 194 with the new nozzle holding member 194, according to the information displayed on the display device by the control device 330. The present nozzle exchanging manner may be performed in combination with the nozzle exchanging manner described in the preceding paragraph.

Each of the two nozzle exchanging manners described in the preceding two paragraphs can be said as a manner in which a large nozzle holding member 194 is divided into two or more small nozzle holding members 194 which cooperate with each other to supply or receive a plurality of EC suction nozzles 84 to or from the respective adaptors 100 of the sixteen shaft members 72, 440.

The adaptors 100 as holder chucks may be replaced with chucks each of which holds an EC suction nozzle 84 as a component holder by applying vacuum thereto, as disclosed in Japanese Patent Application laid open for public inspection under Publication No. 6-296093, or chucks each of which holds a nozzle 84 by utilizing a magnetic force. The magnetic force may be obtained by using a permanent magnet or an electromagnet. In the case where the vacuum or the electromagnet is used for holding the nozzle 84, the nozzle 84 as the component holder may be released from the holder chuck by cutting the supplying of the vacuum or an electric power to the chuck or the electromagnet. Alternatively, the nozzle 84 may be released from the holder chuck by applying, to the nozzle 84 held by the chuck owing to the vacuum or the magnetic force, a force greater than the holding force of the chuck, in a direction in which the nozzle 84 is moved away from the chuck.

In each of the illustrated embodiments, all the sorts of EC suction nozzles 84 have the same or common diameter of their light emitting plates 146, or their tapered portions 136, though having the different diameters of their suction pipes 134. However, the light emitting plates 146 or the tapered portions 136 may have different diameters corresponding to the different diameters of the suction pipes 134. In addition, the small-diameter portions 254 or large-diameter portions 256 of the nozzle holding holes 250 may have different diameters corresponding to the different diameters of the light emitting plates 146 or the tapered portions 136. Each of the holes 250 may be exclusive for a specific, single sort of nozzles 84, or may be common to a plurality of sorts of nozzles 84 having different diameters of their suction pipes 134, their light emitting plates 146, or their tapered portions 136.

The suction-nozzle exchanging operation may be carried out such that at least two of the vertical or horizontal movement of each of the shaft members 72, 440, the vertical movement of the nozzle holding member 194, and the movement of the nozzle-removal inhibiting plate 280 concurrently occur, so long as none of the EC suction nozzles 84, the holding member 194, and the inhibiting plate 280 interfere with one another. For example, when one EC suction nozzle 84 is returned to the nozzle holding member 194, the downward movement of one shaft member 72, 440 holding the one suction nozzle 84, and the upward movement of the nozzle holding member 194 may concurrently occur. In this case, before the downward movement of the one shaft member 72, 440 and the upward movement of the nozzle holding member 194, the nozzle sensor 324 detects and judges whether one EC holding hole 250 to which the one nozzle 84 will be returned is empty. If the one hole 250 is empty, the one shaft member 72, 440 is lowered and the holding member 194 is elevated. However, if the one hole 250 is not empty, i.e., actually holds a nozzle 84, the one shaft member 72, 440 is not lowered and the holding member 194 is not elevated. Thus, the one nozzle 84 held by the one shaft member 72, 440 is prevented from colliding with, or being damaged by, the nozzle 84 which is actually held by the one hole 250 which should have been empty. Otherwise, the downward movement of the one shaft member 72, 440 and the movement of the inhibiting plate 280 to its inoperative position may be concurrently carried out. Moreover, after the one shaft member 72, 440 takes one nozzle 84 from the holding member 194, another shaft member 72, 440 holding another nozzle 84 to be next exchanged may be moved to the EC-suck-and-mount position and then to a position right above another hole 250, concurrently with the downward movement of the holding member 194.

In each of the illustrated embodiments, the suction-nozzle exchanging device 190, 192 is used such that the exchanging of the EC suction nozzles 84 by way of the exchanging of the nozzle holding members 194 is manually carried out by the operator when a current set-up is changed over to a new set-up, that is, in the state in which none of the EC feeders 42 are present on the feeder-support table 40. However, the exchanging of the EC suction nozzles 84 by way of the exchanging of the nozzle holding members 194 may be carried out at a time different from the time when a current set-up is changed over to a new set-up, that is, in the state in which the EC feeders 42 are present on the feeder-support table 40. For example, the respective positions where the holding-member supporting member 204 and the nozzle holding member 194 are provided, and/or the respective constructions of the positioning device which positions the holding member 194 relative to the supporting member 204 and the moving-away preventing device which prevents the holding member 194 from moving away from the supporting member 204, may be so determined as to allow the exchanging of the holding members 194 in the state in which the EC feeders 40 are present on the table 40, i.e., remain attached to the table 40.

In each of the illustrated embodiments, the EC suction nozzle 84 held by each of the adaptors 100 is exchanged with one of the nozzles 84 held by the nozzle holding member 194, by utilizing both the vertical movement of the corresponding shaft member 72, 440 and the vertical movement of the holding member 194 (or the holding-member supporting member 204). However, the exchanging of the nozzles 84 may be carried out by utilizing only the vertical movement of each adaptor 100 as a holder chuck, without utilizing the vertical movement of the holding member 194.

In each of the illustrated embodiments, the alarming device 358 is operated to generate an alarm sound to inform the operator of the occurrence of an abnormality, if one EC holding hole 250 to which the EC suction nozzle 84 held by the adaptor 100 of one shaft member 72, 440 is not empty. Alternatively, the computer 340 or the control device 330 may be adapted to judge whether there are any empty holes 250 each of which can hold the nozzle 84 to be returned to the nozzle holding member 194. If there is at least one empty hole 250, the control device 330 operates for returning the nozzle 84 to the empty hole 250, or an appropriate one of the empty holes 250.

In each of the illustrated embodiments, the nozzle sensor 324 detects and judges whether one nozzle holding hole 250 is holding one EC suction nozzle 84, in the state in which the nozzle holding member 194 is lowered to, and held at, its lower stroke-end position, and the result of this judgment is used in judging whether the holding member 194 may be elevated for the exchanging of the nozzles 84. However, for example, in the case where the exchanging of the nozzles 84 is carried out by utilizing only the vertical movement of each shaft member 72, 440, without utilizing the vertical movement of the nozzle holding member 194, the nozzle sensor 324 may be used for judging whether the adaptor 100 of the each shaft member 72, 440 has returned one nozzle 84 to the holding member 194, or whether the holding member 194 has received the one nozzle 84 from the adaptor 100 and is holding the same 100. Otherwise, the nozzle sensor 324 may be used for detecting and judging, before the adaptor 100 of the each shaft member 72, 440 takes another nozzle 84 from the holding member 194, whether one nozzle holding hole 250 which should be holding that nozzle 84 is actually holding that nozzle 84. In addition, in the case where the vertical movement of the nozzle holding member 194 is utilized, for example, the nozzle sensor 324 may be used for detecting and judging whether one nozzle holding hole 250 from which one EC suction nozzle 84 should have been taken by the adaptor 100 of the each shaft member 72, 440 is actually empty, in the state in which the nozzle holding member 194 is lowered to, and held at, its lower stroke-end position after the adaptor 100 of the each shaft member 72, 440 is elevated for the purpose of taking the one nozzle 84 from the one hole 250 of the holding member 194, and before the each shaft member 72, 440 is moved by the rotation of the intermittent-rotation body 68, 418 and by the movement of the X-Y robot 62, 404. The result of this judgment is used for judging whether the adaptor 100 of the each shaft member 72, 440 has actually take the one nozzle 84 from the one hole 250 of the holding member 194.

The air cylinder 312 which moves the nozzle-removal inhibiting plate 280 may be attached to the holding-member supporting member 204 such that the position of the air cylinder 312 relative to the supporting member 204 is adjustable. In this case, the position of the air cylinder 312 relative to the supporting member 204 may be adjusted such that the recess 318 of the engaging member 316 is aligned with the engaging portion 308 of the inhibiting plate 280. Alternatively, it is possible to employ a stroke adjusting member which adjusts the stroke of the piston rod 314 of the air cylinder 312. In this case, the recess 318 of the engaging member 316 may be aligned with the engaging portion 308 of the inhibiting plate 280, by operating the stroke adjusting member. In each of the two cases, the recess 318 may, or may not, be provided with guide surfaces for guiding the engaging portion 308 of the inhibiting plate 280, into the recess 318.

The exchanging of the nozzle holding members 194 may be automatically carried out by an automatic nozzle-holding-member exchanging device.

The principle of the present invention is applicable to not only an EC transferring and mounting apparatus as described above but also any sort of EC transferring apparatus which receives ECs from an EC supplying device and transfers the ECs to an EC receiving device.

It is to be understood that the present invention may be embodied with other changes, improvements, and modifications that may occur to those skilled in the art without departing from the scope and spirit of the invention defined in the appended claims.

What is claimed is:

1. An electric-component transferring apparatus including a plurality of component holders each ol which holds an electric component, and having the function of exchanging the component holders, the apparatus comprising:
   a holder chuck which holds each of the component holders such that said each component holder is removable therefrom;
   a chuck moving device which moves the holder chuck to transfer the electric component held by said each component holder held by the holder chuck;
   a holder holding member which holds the component holders such that each of the component holders is allowed to be removed therefrom;
   a holding-member holding device which holds the holder holding member such that the holder holding member is removable therefrom without using any tools; and
   a holder-exchange moving device which moves at least one of the holder chuck and the holder holding member relative to each other so that the holder chuck exchanges one of the component holders that is held thereby, with another of the component holders that is held by the holder holding member.

2. An apparatus according to claim 1, wherein the holder chuck holds each of the component holders, with a holding force, such that the holder chuck allows said each component holder to be removed therefrom when a force greater than the holding force is applied to said each component holder in a direction in which said each component holder is moved away from the holder chuck, and wherein the apparatus further comprising:
   a holder-removal inhibiting member which is attached to the holder holding member such that the holder-removal inhibiting member is movable to an operative position thereof where the inhibiting member inhibits each of the component holders from being removed from the holder holding member and to an inoperative position thereof where the inhibiting member allows said each component holder to be removed from the holder holding member; and
   an inhibiting-member moving device which moves the holder-removal inhibiting member to each of the operative and inoperative positions thereof.

3. A method of exchanging a plurality of component holders in an electric-component transferring apparatus which includes a holder chuck which holds each of the component holders such that said each component holder is removable therefrom, the transferring apparatus transferring an electric component held by one of the component holders that is held by the holder chuck, the method comprising the steps of:
   preparing at least two holder holding members,
   causing each of said at least two holder holding members to hold at least two of the component holders such that each of said at least two component holders is allowed to be removed therefrom,
   causing a holding-member holding device to hold at least one of said at least two holder holding members such that said at least one holder holding member is removable therefrom,
   exchanging said one component holder held by the holder chuck, with another of the component holders that is held by said at least one holder holding member held by the holding-member holding device, and
   exchanging said at least one holder holding member held by the holding-member holding device, with at least one of the holder holding members that is not held by the holding-member holding device, so that said at least two component holders held by said at least one holder holding member that is held by the holding-member holding device are exchanged with said at least two component holders held by said at least one holder holding member that is not held by the holding-member holding device.

4. A method according to claim 3, wherein the step of exchanging said one component holder held by the holder chuck, comprises automatically exchanging said one component holder held by the holder chuck, with said another of the component holders that is held by said at least one holder holding member held by the holding-member holding device, and wherein the step of exchanging said at least one holder holding member held by the holding-member holding device, comprises manually exchanging said at least one holder holding member held by the holding-member holding device, with said at least one holder holding member that is not held by the holding-member holding device.

5. A method according to claim 4, wherein the step of exchanging said one component holder held by the holder chuck, comprises operating, for moving the holder chuck relative to said at least one holder holding member, a chuck moving device which is for moving the holder chuck and thereby transferring the electric component held by said one component holder held by the holder chuck.

6. A method according to claim 5, wherein the step of exchanging said one component holder held by the holder chuck, further comprises moving the holding-member holding device to move said at least one holder holding member held thereby, relative to the holder chuck.

7. An apparatus for exchanging a plurality of component holders in an electric-component transferring apparatus which includes a holder chuck which holds each of the component holders such that said each component holder is removable therefrom, the transferring apparatus transferring an electric component held by one of the component holders that is held by the holder chuck, the apparatus comprising:
   at least one holder holding member which holds at least two of the component holders such that each of said at least two component holders is allowed to be removed therefrom; and
   a holding-member holding device which holds the holder holding member such that the holder holding member is removable therefrom without using any tools.

8. An apparatus according to claim 7, wherein the holding-member holding device holds the holder holding member such that the holder holding member is removable therefrom without using any tools.

9. An apparatus according to claim 7, wherein the holding-member holding device comprises:
   a holding-member supporting member having a holding-member supporting surface which supports a supported surface of the holder holding member;
   a positioning device which positions the holder holding member in a direction parallel to the holding-member supporting surface; and
   a moving-away preventing device which prevents the holder holding member from moving away from the holding-member supporting surface.

10. An apparatus according to claim 9, wherein the positioning device comprises:
   a stopper which engages two portions of the holder holding member that are distant from each other in a direction parallel to the supported surface, and which inhibits translation of the holder holding member in a direction in which the holder holding member engages the stopper, and inhibits rotation of the holder holding member in a direction parallel to the supported surface; and
   a parallel-direction biasing device which biases the holder holding member toward the stopper in a direction parallel to the holding-member supporting surface.

11. An apparatus according to claim 10, wherein the moving-away preventing device comprises:
   a moving-away preventing member which engages, in vicinity of the stopper, an engagement surface of the holder holding member that is opposite to the supported surface thereof; and
   a perpendicular-direction biasing device which applies, in a direction in which the supported surface of the holder holding member is moved toward the holding-member supporting surface, a biasing force to one of opposite end portions of the holder holding member that is opposite to the other end portion thereof which engages the stopper.

12. An apparatus according to claim 11, wherein the stopper and the moving-away preventing member are integral with each other.

13. An apparatus according to claim 12, wherein the stopper and the moving-away preventing member comprise two headed pins which are fixed to the holding-member supporting member at two positions which are distant from each other in a direction parallel to the holding-member supporting surface, and the two portions and the engagement surface of the holder holding member comprise two notches which are formed in the holder holding member and which engage respective axial portions of the two headed pins, and two surfaces which surround the two notches, respectively.

14. An apparatus according to claim 11, wherein the parallel-direction biasing device and the perpendicular-direction biasing device are provided by a single biasing device which produces a biasing force having a first direction component to bias the holder holding member toward the stopper and a second direction component to bias the holder holding member toward the holding-member supporting surface.

15. An apparatus according to claim 14, wherein the single biasing device comprises a main member which is attached to one of the holding-member supporting member and the holder holding member, an engaging member which disengageably engages an engageable portion of the other of the holding-member supporting member and the holder holding member, and an elastic member which is provided between the main member and the engaging member.

16. An apparatus according to claim 7, further comprising:
   a holder-removal inhibiting member which is attached to the holder holding member such that the holder-removal inhibiting member is movable to an operative position thereof where the inhibiting member inhibits each of the component holders from being removed from the holder holding member and to an inoperative position thereof where the inhibiting member allows said each component holder to be removed from the holder holding member; and
   an inhibiting-member moving device which moves the holder-removal inhibiting member to each of the operative and inoperative positions thereof.

17. An apparatus according to claim 16, further comprising an inhibiting-member biasing device which is provided between the holder holding member and the holder-removal inhibiting member and which biases the holder-removal inhibiting member to the operative position thereof.

18. An electric-component transferring apparatus including a plurality of component holders each of which holds an electric component, and having the function of exchanging the component holders, the apparatus comprising:
   a holder chuck which holds each of said plurality of component holders such that said each component holder is removable therefrom;
   a chuck moving device which moves the holder chuck to transfer the electric component held by said each component holder held by the holder chuck;
   a first holder holding member which holds at least two first component holders of said plurality of component holders, such that each of said at least two first component holders is allowed to be removed therefrom;
   a holding-member holding device which holds the first holder holding member such that the first holder holding member is removable therefrom and is exchangeable with a second holder holding member which holds at least two second component holders of said plurality of component holders such that each of said at least two second component holders is allowed to be removed therefrom; and
   a holder-exchange moving device which moves at least one of the holder chuck and the first holder holding member held by the holding-member holding device, relative to each other, so that the holder chuck exchanges one of said plurality of component holders that is held thereby, with one of said at least two first component holders held by the first holder holding member.

19. An apparatus for exchanging a plurality of component holders in an electric-component transferring apparatus which includes a holder chuck which holds each of said plurality of component holders such that said each component holder is removable therefrom, the transferring apparatus transferring an electric component held by one of said plurality of component holders that is held by the holder chuck, the apparatus comprising:

at least one first holder holding member which holds at least two first component holders of said plurality of component holders such that each of said at least two first component holders is allowed to be removed therefrom; and a holding-member holding device which holds said at least one first holder holding member such that said at least one first holder holding member is removable therefrom and is exchangeable with at least one second holder holding member which holds at least two second component holders of said plurality of component holders such that each of said at least two second component holders is allowed to be removed therefrom.

\* \* \* \* \*